United States Patent
Kim et al.

(10) Patent No.: US 12,428,522 B2
(45) Date of Patent: *Sep. 30, 2025

(54) POLYMER COMPOSITION FOR LASER DIRECT STRUCTURING

(71) Applicant: Ticona LLC, Florence, KY (US)

(72) Inventors: Young Shin Kim, Cincinnati, OH (US); Xiaowei Zhang, Union, KY (US)

(73) Assignee: Ticona LLC, Florence, KY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/421,371

(22) Filed: Jan. 24, 2024

(65) Prior Publication Data

US 2024/0166803 A1 May 23, 2024

Related U.S. Application Data

(63) Continuation of application No. 16/995,980, filed on Aug. 18, 2020, now Pat. No. 11,912,817.

(60) Provisional application No. 63/056,865, filed on Jul. 27, 2020, provisional application No. 63/024,584, filed on May 14, 2020, provisional application No. 63/009,017, filed on Apr. 13, 2020, provisional application No. 62/994,329, filed on Mar. 25, 2020, provisional application No. 62/972,195, filed on Feb. 10, 2020, provisional application No. 62/951,039, filed on Dec. 20, 2019, provisional application No. 62/925,274, filed on Oct. 24, 2019, provisional application No. 62/898,188, filed on Sep. 10, 2019.

(51) Int. Cl.

| | |
|---|---|
| *C08G 63/183* | (2006.01) |
| *C08G 63/189* | (2006.01) |
| *C08K 3/22* | (2006.01) |
| *C08K 3/34* | (2006.01) |
| *C08K 7/14* | (2006.01) |
| *H01Q 1/22* | (2006.01) |
| *H01Q 21/28* | (2006.01) |
| *H05K 3/00* | (2006.01) |
| *C08L 27/18* | (2006.01) |

(52) U.S. Cl.
CPC ......... *C08G 63/183* (2013.01); *C08G 63/189* (2013.01); *C08K 3/22* (2013.01); *C08K 3/34* (2013.01); *C08K 7/14* (2013.01); *H01Q 1/2291* (2013.01); *H01Q 21/28* (2013.01); *H05K 3/0026* (2013.01); *C08G 2250/00* (2013.01); *C08K 2201/001* (2013.01); *C08L 27/18* (2013.01); *H05K 2203/0104* (2013.01); *H05K 2203/107* (2013.01)

(58) Field of Classification Search
CPC .......... C08G 63/1489; C08G 63/605; C08G 63/183; C08G 2250/00; C08K 3/346; C08K 3/22; C08K 3/34; C08K 7/14; C08K 7/20; C08K 2201/001; C08L 2003/2251; C08L 67/03; C08L 27/18; H05K 3/0026; H05K 3/105; H05K 1/0326; H05K 2203/107; H05K 2203/104; H05K 2201/0141; H01Q 21/28; H01Q 1/2291

USPC .............. 528/308.1, 308, 272, 271; 520/1
See application file for complete search history.

(56) References Cited

U.S. PATENT DOCUMENTS

| | | | |
|---|---|---|---|
| 4,162,466 | A | 7/1979 | Hunsinger et al. |
| 4,458,039 | A | 7/1984 | Eickman |
| 4,746,694 | A | 5/1988 | Charbonneau et al. |
| 4,960,654 | A | 10/1990 | Yoshinaka et al. |
| 5,032,627 | A | 7/1991 | Wilson et al. |
| 5,348,990 | A | 9/1994 | Walpita et al. |
| 5,541,240 | A | 7/1996 | Makhija et al. |
| 5,624,984 | A | 4/1997 | Furuta et al. |
| 5,767,195 | A | 6/1998 | Furuta et al. |
| 6,121,369 | A | 9/2000 | Stack et al. |
| 6,303,524 | B1 | 10/2001 | Sharangpani et al. |
| 6,346,864 | B1 | 2/2002 | Kadota |
| 6,350,822 | B1 | 2/2002 | Van Diepen et al. |
| 6,495,616 | B2 | 12/2002 | Maeda |
| 6,641,928 | B2 | 11/2003 | Takeichi et al. |
| 6,756,427 | B2 | 6/2004 | Maeda |
| 6,818,821 | B2 | 11/2004 | Fujieda et al. |
| 6,894,141 | B2 | 5/2005 | Satoh et al. |
| 6,984,712 | B2 | 1/2006 | Ueno et al. |
| 7,014,921 | B2 | 3/2006 | Okamoto et al. |
| 7,063,892 | B2 | 6/2006 | Okamoto et al. |
| 7,079,405 | B2 | 7/2006 | Tobita et al. |
| 7,148,311 | B2 | 12/2006 | Benicewicz et al. |
| 7,180,172 | B2 | 2/2007 | Sethumadhaven et al. |

(Continued)

FOREIGN PATENT DOCUMENTS

| | | |
|---|---|---|
| CN | 104961916 A | 10/2015 |
| CN | 104961922 A | 10/2015 |

(Continued)

OTHER PUBLICATIONS

Amato, Ing. Francesco, Ph.D., "A Primer on 5G," Jan. 11, 2019, 19 pages.

(Continued)

*Primary Examiner* — Jessica Whiteley
(74) *Attorney, Agent, or Firm* — Dority & Manning, P.A.

(57) ABSTRACT

A laser activatable polymer composition is provided. The composition contains at least one laser activatable additive and at least one high naphthenic thermotropic liquid crystalline polymer that contains repeating units derived from naphthenic hydroxycarboxylic and/or dicarboxylic acids in an amount of about 10 mol. % or more. The polymer composition exhibits a dielectric constant of about 5 or less as determined at a frequency of 2 GHz.

20 Claims, 10 Drawing Sheets

(56) References Cited

U.S. PATENT DOCUMENTS

| | | | |
|---|---|---|---|
| 7,223,807 B2 | 5/2007 | Okamoto et al. |
| 7,239,261 B2 | 7/2007 | Fujieda et al. |
| 7,247,590 B2 | 7/2007 | Kawabata et al. |
| 7,314,898 B2 | 1/2008 | Downing, Jr. et al. |
| 7,455,901 B2 | 11/2008 | Yano et al. |
| 7,504,150 B2 | 3/2009 | Lee et al. |
| 7,531,204 B2 | 5/2009 | Lee et al. |
| 7,547,849 B2 | 6/2009 | Lee et al. |
| 7,583,226 B2 | 9/2009 | Sakurada |
| 7,618,553 B2 | 11/2009 | Kim et al. |
| 7,648,758 B2 | 1/2010 | Morin |
| 7,704,408 B2 | 4/2010 | Fukatsu |
| 7,713,439 B2 | 5/2010 | Murouchi et al. |
| 7,737,198 B2 | 6/2010 | Murouchi et al. |
| 7,790,786 B2 | 9/2010 | Murouchi et al. |
| 7,816,014 B2 | 10/2010 | Ito et al. |
| 7,897,083 B2 | 3/2011 | Fukatsu et al. |
| 7,985,351 B2 | 7/2011 | Yamauchi et al. |
| 8,012,352 B1 | 9/2011 | Eugenio et al. |
| 8,025,814 B2 | 9/2011 | Uehara et al. |
| 8,043,527 B2 | 10/2011 | Iwase et al. |
| 8,044,151 B2 | 10/2011 | Asahara et al. |
| 8,066,907 B2 | 11/2011 | Kohinata et al. |
| 8,192,645 B2 | 6/2012 | Murouchi et al. |
| 8,222,802 B2 | 7/2012 | Saito et al. |
| 8,226,851 B2 | 7/2012 | Harada et al. |
| 8,231,807 B2 | 7/2012 | Yonezawa et al. |
| 8,309,640 B2 | 11/2012 | Li et al. |
| 8,337,719 B2 | 12/2012 | Hosoda et al. |
| 8,425,798 B2 | 4/2013 | Saito et al. |
| 8,475,924 B2 | 7/2013 | Lee et al. |
| 8,492,464 B2 | 7/2013 | Li et al. |
| 8,545,718 B2 | 10/2013 | Nakayama et al. |
| 8,580,145 B2 | 11/2013 | Osato et al. |
| 8,641,924 B2 | 2/2014 | Sekimura et al. |
| 8,642,682 B2 | 2/2014 | Nishihata |
| 8,692,272 B2 | 4/2014 | Matsumi et al. |
| 8,703,011 B2 | 4/2014 | Wang et al. |
| 8,715,526 B2 | 5/2014 | Kitai et al. |
| 8,816,019 B2 | 8/2014 | Ganguly et al. |
| 8,841,367 B2 | 9/2014 | Zheng et al. |
| 8,883,900 B2 | 11/2014 | Jiang et al. |
| 8,894,880 B2 | 11/2014 | Shin et al. |
| 8,895,649 B2 | 11/2014 | Li et al. |
| 8,926,862 B2 | 1/2015 | Kim et al. |
| 8,927,661 B2 | 1/2015 | Li et al. |
| 8,946,333 B2 | 2/2015 | Raman et al. |
| 8,992,805 B2 | 3/2015 | Nishimura et al. |
| 9,018,286 B2 | 4/2015 | Daga et al. |
| 9,023,923 B2 | 5/2015 | An et al. |
| 9,074,070 B2 | 7/2015 | Yung et al. |
| 9,178,281 B2 | 11/2015 | Kasai |
| 9,185,800 B2 | 11/2015 | Meng et al. |
| 9,206,300 B2 | 12/2015 | Zhao et al. |
| 9,234,092 B2 | 1/2016 | Nakayama et al. |
| 9,258,892 B2 | 2/2016 | Crosley |
| 9,283,707 B2 | 3/2016 | Saito et al. |
| 9,355,753 B2 | 5/2016 | Kim |
| 9,394,483 B2 | 7/2016 | Wu et al. |
| 9,538,646 B2 | 1/2017 | Onodera et al. |
| 9,574,065 B2 | 2/2017 | Miyamoto et al. |
| 9,850,343 B2 | 12/2017 | Konishi et al. |
| 9,896,566 B2 | 2/2018 | Yung et al. |
| 9,944,768 B2 | 4/2018 | Cheng et al. |
| 9,982,113 B2 | 5/2018 | Kniess et al. |
| 10,106,682 B2 | 10/2018 | Kim |
| 10,119,021 B2 | 11/2018 | Li et al. |
| 10,150,863 B2 | 12/2018 | Wu et al. |
| 10,174,180 B2 | 1/2019 | Bao et al. |
| 10,233,301 B2 | 3/2019 | Kato et al. |
| 10,273,362 B2 | 4/2019 | Zhang et al. |
| 10,290,389 B2 | 5/2019 | Wu et al. |
| 10,329,422 B2 | 6/2019 | Li et al. |
| 10,604,649 B2 | 3/2020 | Yamanaka |
| 10,696,787 B2 | 6/2020 | Takasuka et al. |
| 10,697,065 B2 | 6/2020 | Hua et al. |
| 10,714,810 B2 | 7/2020 | Hong et al. |
| 10,741,932 B2 | 8/2020 | Thai et al. |
| 10,767,049 B2 | 9/2020 | Kim |
| 10,784,030 B2 | 9/2020 | Lee et al. |
| 10,822,452 B2 | 11/2020 | Tsuchiya et al. |
| 10,822,453 B2 | 11/2020 | Washino |
| 10,899,900 B2 | 1/2021 | Jung et al. |
| 10,968,311 B2 | 4/2021 | Washino |
| 10,968,347 B2 | 4/2021 | Akiyama et al. |
| 11,028,250 B2 | 6/2021 | Zhang et al. |
| 11,075,442 B2 | 7/2021 | Wang et al. |
| 11,505,647 B2 | 11/2022 | Washino |
| 11,674,083 B2 | 6/2023 | Konno et al. |
| 11,728,559 B2 | 8/2023 | Kim |
| 11,912,817 B2 * | 2/2024 | Kim | C08G 63/183 |
| 2004/0165390 A1 | 8/2004 | Sato et al. |
| 2005/0130447 A1 | 6/2005 | Takaya et al. |
| 2007/0010647 A1 | 1/2007 | Ueno et al. |
| 2007/0057236 A1 | 3/2007 | Hosoda et al. |
| 2010/0012354 A1 | 1/2010 | Hedin et al. |
| 2010/0051999 A1 | 3/2010 | Iwase et al. |
| 2010/0053972 A1 | 3/2010 | Nakayama |
| 2010/0263919 A1 | 10/2010 | Lee et al. |
| 2010/0327728 A1 | 12/2010 | Saito et al. |
| 2012/0040128 A1 | 2/2012 | Finn |
| 2012/0276390 A1 | 11/2012 | Ji et al. |
| 2014/0060899 A1 | 3/2014 | Park et al. |
| 2014/0128545 A1 | 5/2014 | Xiong et al. |
| 2014/0142571 A1 | 5/2014 | Yung et al. |
| 2014/0159285 A1 | 6/2014 | Choi |
| 2014/0171567 A1 | 6/2014 | Guo et al. |
| 2014/0296411 A1 | 10/2014 | Cheng et al. |
| 2014/0353543 A1 | 12/2014 | Wu et al. |
| 2015/0337132 A1 | 11/2015 | Van der Burgt |
| 2016/0116948 A1 | 4/2016 | Ou et al. |
| 2016/0301141 A1 | 10/2016 | Del Castillo et al. |
| 2017/0002193 A1 | 1/2017 | Cheng et al. |
| 2017/0273179 A1 | 9/2017 | Kim |
| 2017/0361584 A1 | 12/2017 | Feng et al. |
| 2017/0362731 A1 | 12/2017 | Wang et al. |
| 2017/0367182 A1 | 12/2017 | Wu et al. |
| 2018/0215894 A1 | 8/2018 | Cheng et al. |
| 2018/0230294 A1 | 8/2018 | Cheng et al. |
| 2018/0332710 A1 | 11/2018 | Lin et al. |
| 2018/0346711 A1 | 12/2018 | Van der Burgt et al. |
| 2018/0355150 A1 | 12/2018 | Kim |
| 2018/0362758 A1 | 12/2018 | Wu et al. |
| 2019/0027813 A1 | 1/2019 | Wang |
| 2019/0031879 A1 | 1/2019 | Ding et al. |
| 2019/0153216 A1 | 5/2019 | Gong et al. |
| 2019/0237851 A1 | 8/2019 | Gu |
| 2019/0269012 A1 | 8/2019 | Van der Burgt |
| 2019/0322861 A1 | 10/2019 | Wei et al. |
| 2019/0341696 A1 | 11/2019 | O'Connor et al. |
| 2019/0352501 A1 | 11/2019 | Wang et al. |
| 2019/0352503 A1 | 11/2019 | Cheng et al. |
| 2020/0017769 A1 | 1/2020 | Konno et al. |
| 2020/0022264 A1 | 1/2020 | Cheng et al. |
| 2020/0040133 A1 | 2/2020 | Washino |
| 2020/0076035 A1 | 3/2020 | Huh et al. |
| 2020/0091608 A1 | 3/2020 | Alpman et al. |
| 2020/0219861 A1 | 7/2020 | Kamgaing et al. |
| 2020/0299582 A1 | 9/2020 | Komatsu |
| 2020/0308487 A1 | 10/2020 | Hegi |
| 2020/0347224 A1 | 11/2020 | Hara |
| 2020/0369884 A1 | 11/2020 | Lee et al. |
| 2020/0399465 A1 | 12/2020 | Hara |
| 2021/0002507 A1 | 1/2021 | Azami et al. |
| 2021/0024687 A1 | 1/2021 | Ohtomo et al. |
| 2021/0024701 A1 | 1/2021 | Wang et al. |
| 2021/0054190 A1 | 2/2021 | Kim |
| 2021/0057811 A1 | 2/2021 | Kim |
| 2021/0057827 A1 | 2/2021 | Kim et al. |
| 2021/0070927 A1 | 3/2021 | Zhang et al. |
| 2021/0070983 A1 | 3/2021 | Kim et al. |
| 2021/0075093 A1 | 3/2021 | Zhang et al. |
| 2021/0075162 A1 | 3/2021 | Kim et al. |
| 2021/0091818 A1 | 3/2021 | Zhang et al. |

(56) References Cited

U.S. PATENT DOCUMENTS

| | | |
|---|---|---|
| 2021/0092836 A1 | 3/2021 | Zhang et al. |
| 2021/0130585 A1 | 5/2021 | Wang et al. |
| 2021/0130604 A1 | 5/2021 | Ramakrishnan et al. |
| 2021/0143539 A1 | 5/2021 | Yuan et al. |
| 2021/0251074 A1 | 8/2021 | Onodera et al. |
| 2021/0269588 A1 | 9/2021 | Washino |
| 2021/0274652 A1 | 9/2021 | Kim |
| 2021/0292475 A1 | 9/2021 | Konishi et al. |
| 2022/0073732 A1 | 3/2022 | Washino |
| 2022/0302581 A1 | 9/2022 | Sunamoto et al. |
| 2023/0065239 A1 | 3/2023 | Konishi et al. |
| 2023/0069551 A1 | 3/2023 | Ohtomo et al. |

FOREIGN PATENT DOCUMENTS

| | | |
|---|---|---|
| CN | 105504247 A | 4/2016 |
| CN | 105542408 A | 5/2016 |
| CN | 106633680 A | 5/2017 |
| CN | 106633859 A | 5/2017 |
| CN | 107022171 A | 8/2017 |
| CN | 105623206 B | 12/2017 |
| CN | 108045022 A | 5/2018 |
| CN | 108102314 A | 6/2018 |
| CN | 108178906 A | 6/2018 |
| CN | 108250692 A | 7/2018 |
| CN | 207772540 U | 8/2018 |
| CN | 105860036 B | 9/2018 |
| CN | 108148433 A | 12/2018 |
| CN | 109301507 A | 2/2019 |
| CN | 109467643 A | 3/2019 |
| CN | 109467722 A | 3/2019 |
| CN | 109509975 A | 3/2019 |
| CN | 208675597 U | 3/2019 |
| CN | 106633860 B | 4/2019 |
| CN | 106750198 B | 5/2019 |
| CN | 109735060 A | 5/2019 |
| CN | 109742534 A | 5/2019 |
| CN | 109755729 A | 5/2019 |
| CN | 109755733 A | 5/2019 |
| CN | 109790361 A | 5/2019 |
| CN | 208904227 U | 5/2019 |
| CN | 110154464 A | 8/2019 |
| CN | 209266563 U | 8/2019 |
| CN | 209266570 U | 8/2019 |
| CN | 209266571 U | 8/2019 |
| CN | 108884329 B | 10/2019 |
| CN | 209516005 U | 10/2019 |
| CN | 209544599 U | 10/2019 |
| CN | 110505753 A | 11/2019 |
| CN | 110527071 A | 12/2019 |
| CN | 110746754 A | 2/2020 |
| CN | 110769594 A | 2/2020 |
| CN | 110177821 B | 3/2020 |
| CN | 110862523 A | 3/2020 |
| CN | 110903612 A | 3/2020 |
| CN | 111087765 A | 5/2020 |
| CN | 111087797 A | 5/2020 |
| CN | 111117169 A | 5/2020 |
| CN | 111286176 A | 6/2020 |
| CN | 111320848 A | 6/2020 |
| CN | 210706390 U | 6/2020 |
| CN | 111393806 A | 7/2020 |
| CN | 110603278 B | 2/2021 |
| CN | 109705322 B | 9/2021 |
| CN | 109661433 B | 5/2022 |
| CN | 111936547 B | 5/2022 |
| CN | 115279832 A | 11/2022 |
| EP | 2 774 952 B1 | 9/2014 |
| EP | 2 981 573 B1 | 6/2018 |
| EP | 3 674 080 A1 | 7/2020 |
| EP | 3 674 368 A1 | 7/2020 |
| EP | 3 730 545 A1 | 10/2020 |
| JP | 2003268089 A | 9/2003 |
| JP | 2003268241 A | 9/2003 |
| JP | 2004143270 A | 5/2004 |
| JP | 2004277539 A | 10/2004 |
| JP | 2004323705 A | 11/2004 |
| JP | 2005078806 A | 3/2005 |
| JP | 4945097 B2 | 1/2007 |
| JP | 2007154169 A | 6/2007 |
| JP | 2007273537 A | 10/2007 |
| JP | 2009114418 A | 5/2009 |
| JP | 4339966 B2 | 10/2009 |
| JP | 2010254875 A | 11/2010 |
| JP | 2011052037 A | 3/2011 |
| JP | 2011093973 A | 5/2011 |
| JP | 2013108008 A | 6/2013 |
| JP | 5280281 B2 | 9/2013 |
| JP | 5332081 B2 | 11/2013 |
| JP | 2015059178 A | 3/2015 |
| JP | 5866423 B2 | 2/2016 |
| JP | 2016041828 A | 3/2016 |
| JP | 5919613 B2 | 5/2016 |
| JP | 5924527 B2 | 5/2016 |
| JP | 2017095625 A | 6/2017 |
| JP | 2017119378 A | 7/2017 |
| JP | 2017120826 A | 7/2017 |
| JP | 6177191 B2 | 8/2017 |
| JP | 6181587 B2 | 8/2017 |
| JP | 2017179127 A | 10/2017 |
| JP | 2018016753 A | 2/2018 |
| JP | 2018016754 A | 2/2018 |
| JP | 2018029187 A | 2/2018 |
| JP | 6295013 B2 | 3/2018 |
| JP | 2018030948 A | 3/2018 |
| JP | 6306369 B2 | 4/2018 |
| JP | 6359225 B2 | 7/2018 |
| JP | 2018109090 A | 7/2018 |
| JP | 6405817 B2 | 10/2018 |
| JP | 6405818 B2 | 10/2018 |
| JP | 2018168320 A | 11/2018 |
| JP | 2019006973 A | 1/2019 |
| JP | 6470295 B2 | 2/2019 |
| JP | 2019065263 A | 4/2019 |
| JP | 6533880 B1 | 6/2019 |
| JP | 6533881 B1 | 6/2019 |
| JP | 2019094489 A | 6/2019 |
| JP | 2019094497 A | 6/2019 |
| JP | 2019099618 A | 6/2019 |
| JP | 2019106434 A | 6/2019 |
| JP | 2019116586 A | 7/2019 |
| JP | 2019127556 A | 8/2019 |
| JP | 2019127557 A | 8/2019 |
| JP | 6574281 B2 | 9/2019 |
| JP | 6576754 B2 | 9/2019 |
| JP | 6576808 B2 | 9/2019 |
| JP | 2019189734 A | 10/2019 |
| JP | 2019189735 A | 10/2019 |
| JP | 2019189736 A | 10/2019 |
| JP | 2019189737 A | 10/2019 |
| JP | 6773824 B2 | 10/2020 |
| JP | 2020193261 A | 12/2020 |
| JP | 6837189 B1 | 3/2021 |
| JP | 6854124 B2 | 4/2021 |
| JP | 2021066776 A | 4/2021 |
| JP | 6900151 B2 | 7/2021 |
| JP | 6930784 B2 | 9/2021 |
| JP | 6998189 B2 | 1/2022 |
| JP | 7111500 B2 | 8/2022 |
| JP | 7111501 B2 | 8/2022 |
| JP | 7111502 B2 | 8/2022 |
| JP | 7116546 B2 | 8/2022 |
| JP | 7156814 B2 | 10/2022 |
| JP | 7159693 B2 | 10/2022 |
| KR | 20140074094 A | 6/2014 |
| KR | 20140074095 A | 6/2014 |
| KR | 101757308 B1 | 7/2017 |
| KR | 101792873 B1 | 11/2017 |
| KR | 101817365 B1 | 1/2018 |
| KR | 101817366 B1 | 1/2018 |
| KR | 101834703 B1 | 3/2018 |
| KR | 102104752 B1 | 4/2020 |
| KR | 102104753 B1 | 4/2020 |
| KR | 20200070501 A | 6/2020 |

(56) References Cited

FOREIGN PATENT DOCUMENTS

| | | | |
|---|---|---|---|
| KR | 102167337 B1 | 10/2020 | |
| WO | WO-2013066663 A2 * | 5/2013 | ............... C08K 3/22 |
| WO | WO 2014/162254 A1 | 10/2014 | |
| WO | WO 2014/180550 A1 | 11/2014 | |
| WO | WO 2014/203227 A2 | 12/2014 | |
| WO | WO-2015147916 A1 * | 10/2015 | ............... C08L 67/04 |
| WO | WO 2017/029608 A1 | 2/2017 | |
| WO | WO 2018/026601 A1 | 2/2018 | |
| WO | WO 2018/038093 A1 | 3/2018 | |
| WO | WO 2018/056294 A1 | 3/2018 | |
| WO | WO 2018/141769 A1 | 8/2018 | |
| WO | WO 2019/042906 A1 | 3/2019 | |
| WO | WO 2019/213920 A1 | 11/2019 | |
| WO | WO 2020/095997 A1 | 5/2020 | |
| WO | WO 2020/194196 A1 | 10/2020 | |
| WO | WO 2020/217225 A1 | 10/2020 | |

OTHER PUBLICATIONS

Bjornson, Emil, "Massive MIMO for 5G," Tutorial at 2015 IEEE International Workshop on Signal Processing Advances in Wireless Communications, (SPAWC), Jun. 29, Stockholm, Sweden 58 pages.

Hassan et al., Massive MIMO Wireless Networks: An Overview, *Electronics*, 2017, 6, 63, pp. 1-29.

Jilani et al., "Millimeter-wave Liquid Crystal Polymer Based Antenna Array for Conformal 5G Applications," *IEEE Antennas and Wireless Propagation Letters*, vol. 18, Issue 1, Jan. 2019, pp. 84-88.

Paper—The Fifth Generation of Wireless Network Communications from TE Connectivity, Apr. 2019, 20 pages.

Paper—Material Solutions for 5G Applications from SABIC, 2018, 4 pages.

Takata, et al., "Electrical properties and practical applications of Liquid Crystal Polymer flex," *IEEE Polytronic 2007 Conference*, pp. 67-72.

Technical Article—Plastic Materials—Liquid Crystal Polymers from Steinwall Plastic Injection Molding, May 2016, 3 pages.

Theil et al., "The Effect of Thermal Cycling on a-C:F,H Low Dielectric Constant Films Deposited by ECR Plasma Enhanced Chemical Vapor Deposition," *Proceedings for the International Interconnect Technology Conference*, Jun. 1998, p. 128-131, 3 pages.

International Search Report and Written Opinion for PCT/US2020/046924 dated Nov. 9, 2020, 9 pages.

\* cited by examiner

POLYMER COMPOSITION FOR LASER DIRECT STRUCTURING

CROSS REFERENCE TO RELATED APPLICATIONS

The present application is a continuation of U.S. patent application Ser. No. 16/995,980 having a filing date of Aug. 18, 2020, which claims filing benefit of U.S. Provisional Patent Application Ser. No. 62/898,188 having a filing date of Sep. 10, 2019; U.S. Provisional Patent Application Ser. No. 62/925,274 having a filing date of Oct. 24, 2019; U.S. Provisional Patent Application Ser. No. 62/951,039 having a filing date of Dec. 20, 2019; U.S. Provisional Patent Application Ser. No. 62/972,195 having a filing date of Feb. 10, 2020; United States Provisional Patent Application Ser. No. 62/994,329 having a filing date of Mar. 25, 2020; United States Provisional Patent Application Ser. No. 63/009,017 having a filing date of Apr. 13, 2020; U.S. Provisional Application Ser. No. 63/024,584 having a filing date of May 14, 2020; and U.S. Provisional Application Ser. No. 63/056,865 having a filing date of Jul. 27, 2020, which are incorporated herein by reference in their entirety.

BACKGROUND OF THE INVENTION

To form the antenna structure of various electronic components, molded interconnect devices ("MID") often contain a plastic substrate on which is formed conductive elements or pathways. Such MID devices are thus three-dimensional molded parts having an integrated printed conductor or circuit layout. It is becoming increasingly popular to form MIDs using a laser direct structuring ("LDS") process during which a computer-controlled laser beam travels over the plastic substrate to activate its surface at locations where the conductive path is to be situated. With a laser direct structuring process, it is possible to obtain conductive element widths and spacings of 150 microns or less. As a result, MIDs formed from this process save space and weight in the end-use applications. Various materials have been proposed for forming the plastic substrate of a laser direct structured-MID device. For example, one such material is a blend of polycarbonate, acrylonitrile butadiene styrene ("ABS"), copper chromium oxide spinel, and a bisphenol A diphenyl phosphate ("BPADP") flame retardant. One problem with such materials, however, is that the flame retardant tends to adversely impact the mechanical properties (e.g., deformation temperature under load) of the composition, which makes it difficult to use in laser direct structuring processes. Liquid crystalline polymer formulations have been developed in an attempt to solve these problems, but these formulations tend to have too high of a dielectric constant to make them suitable for use in high frequency applications (e.g., 5G) in which there is in an increased amount of power consumption and heat generation.

As such, a need exists for a polymer composition that can be activated by laser direct structuring and has a relatively low dielectric constant.

SUMMARY OF THE INVENTION

In accordance with one embodiment of the present invention, a polymer composition is disclosed that comprises at least one laser activatable additive and at least one high naphthenic thermotropic liquid crystalline polymer that contains repeating units derived from naphthenic hydroxycarboxylic and/or dicarboxylic acids in an amount of about 10 mol. % or more. The polymer composition exhibits a dielectric constant of about 5 or less as determined at a frequency of 2 GHz.

Other features and aspects of the present invention are set forth in greater detail below.

BRIEF DESCRIPTION OF THE FIGURES

A full and enabling disclosure of the present invention, including the best mode thereof to one skilled in the art, is set forth more particularly in the remainder of the specification, including reference to the accompanying figures, in which.

DETAILED DESCRIPTION

Figure 1:
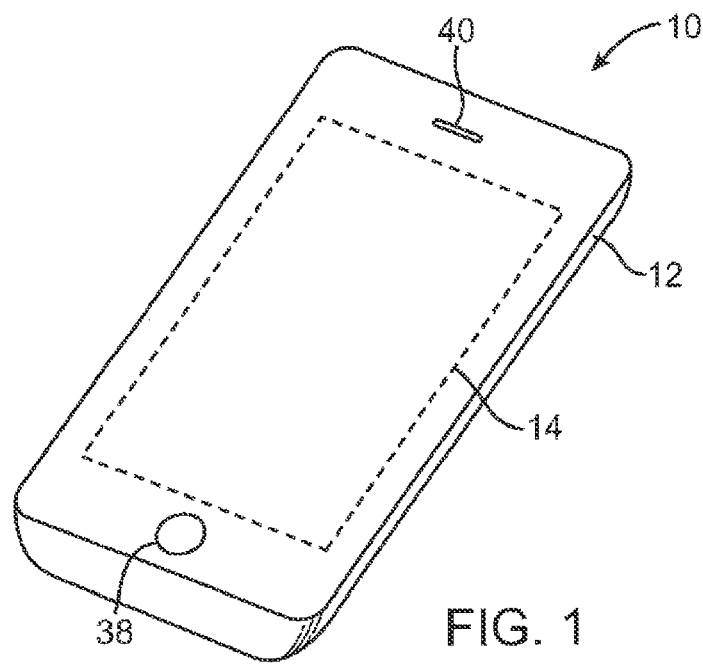
FIGS. 1-2 are respective front and rear perspective views of one embodiment of an electronic component that can employ an antenna system.

It is to be understood by one of ordinary skill in the art that the present discussion is a description of exemplary embodiments only, and is not intended as limiting the broader aspects of the present invention.

Generally speaking, the present invention is directed to a polymer composition that contains a combination of a thermotropic liquid crystalline polymer and laser activatable additive. More particularly, the polymer composition contains a liquid crystalline polymer having a "high naphthenic" content to the extent that it contains a relatively high content of repeating units derived from naphthenic hydroxycarboxylic acids and naphthenic dicarboxylic acids, such as NDA, HNA, or combinations thereof. That is, the total amount of repeating units derived from naphthenic hydroxycarboxylic and/or dicarboxylic acids (e.g., NDA, HNA, or a combination of HNA and NDA) is typically about 10 mol. % or more, in some embodiments about 12 mol. % or more, in some embodiments about 15 mol. % or more, in some embodiments about 18 mol. % or more, in some embodiments about 30 mol. % or more, in some embodiments about 40 mol. % or more, in some embodiments about 45 mol. % or more, in some embodiments about 50 mol. % or more, in some embodiments about 60 mol. % or more, in some embodiments about 62 mol. % or more, in some embodiments about 68 mol. % or more, in some embodiments about 70 mol. % or more, and in some embodiments, from about 70 mol. % to about 80 mol. % of the polymer. Without intending to be limited by theory, it is believed that such "high naphthenic" polymers are capable of reducing the tendency of the polymer composition to absorb water, which can help stabilize the dielectric constant at high frequency ranges. Namely, such high naphthenic polymers typically have a water adsorption of about 0.015% or less, in some embodiments about 0.01% or less, and in some embodiments, from about 0.0001% to about 0.008% after being immersed in water for 24 hours in accordance with ISO 62-1:2008. The high naphthenic polymers may also have a moisture adsorption of about 0.01% or less, in some embodiments about 0.008% or less, and in some embodiments, from about 0.0001% to about 0.006% after being exposed to a humid atmosphere (50% relative humidity) at a temperature of 23° C. in accordance with ISO 62-4:2008.

Through careful selection of the particular nature and concentration of the components of the polymer composition, the present inventors have discovered that the resulting composition can exhibit a low dielectric constant over a wide range of frequencies, making it particularly suitable for use in 5G applications. That is, the polymer composition may exhibit a low dielectric constant of about 5 or less, in some embodiments about 4.5 or less, in some embodiments from about 0.1 to about 4.4, in some embodiments from about 1 to about 4.2, in some embodiments from about 1.5 to about 4, in some embodiments from about 2 to about 3.9, and in some embodiments, from about 3.5 to about 3.9, as determined by the split post resonator method over typical 5G frequencies (e.g., 2 GHz). The dissipation factor of the polymer composition, which is a measure of the loss rate of energy, may likewise be about 0.05 or less, in some embodiments about 0.01 or less, in some embodiments from about 0.0001 to about 0.008, and in some embodiments from about 0.0002 to about 0.006 over typical 5G frequencies (e.g., 2 or 10 GHz). In fact, in some cases, the dissipation factor may be very low, such as about 0.003 or less, in some embodiments about 0.002 or less, in some embodiments about 0.001 or less, in some embodiments, about 0.0009 or less, in some embodiments about 0.0008 or less, and in some embodiments, from about 0.0001 to about 0.0007 over typical 5G frequencies (e.g., 2 or 10 GHz). Notably, the present inventors have also surprisingly discovered that the dielectric constant and dissipation factor can be maintained within the ranges noted above even when exposed to various temperatures, such as a temperature of from about −30° C. to about 100° C. For example, when subjected to a heat cycle test as described herein, the ratio of the dielectric constant after heat cycling to the initial dielectric constant may be about 0.8 or more, in some embodiments about 0.9 or more, and in some embodiments, from about 0.91 to about 0.99. Likewise, the ratio of the dissipation after being exposed to the high temperature to the initial dissipation factor may be about 1 or less, in some embodiments about 0.95 or less, in some embodiments from about 0.1 to about 0.9, and in some embodiments, from about 0.2 to about 0.8. The change in dissipation factor (i.e., the initial dissipation factor—the dissipation factor after heat cycling) may also range from about −0.1 to about 0.1, in some embodiments from about −0.05 to about 0.01, and in some embodiments, from about −0.001 to 0.

Conventionally, it was believed that polymer compositions exhibiting a low dissipation factor and dielectric constant would not be laser activatable, nor would they possess sufficiently good thermal, mechanical properties and ease in processing (i.e., low viscosity) to enable their use in certain types of applications. Contrary to conventional thought, however, the polymer composition has been found to possess both excellent thermal, mechanical properties and processability. The melting temperature of the composition may, for instance, be from about 250° C. to about 440° C., in some embodiments from about 270° C. to about 400° C., and in some embodiments, from about 300° C. to about 380° C. Even at such melting temperatures, the ratio of the deflection temperature under load ("DTUL"), a measure of short term heat resistance, to the melting temperature may still remain relatively high. For example, the ratio may range from about 0.5 to about 1.00, in some embodiments from about 0.6 to about 0.95, and in some embodiments, from about 0.65 to about 0.85. The specific DTUL values may, for instance, range from about 200° C. to about 350° C., in some embodiments from about 210° C. to about 320° C., and in some embodiments, from about 230° C. to about 290° C. Such high DTUL values can, among other things, allow the use of high speed and reliable surface mounting processes for mating the structure with other components of the electrical component.

The polymer composition may also possess a high impact strength, which is useful when forming thin substrates. The composition may, for instance, possess a Charpy notched impact strength of about 0.5 kJ/m$^2$ or more, in some embodiments from about 1 to about 50 kJ/m$^2$, and in some embodiments, from about 2 to about 20 kJ/m$^2$, as determined at a temperature of 23° C. in accordance with ISO Test No. ISO 179-1:2010. The tensile and flexural mechanical properties of the composition may also be good. For example, the polymer composition may exhibit a tensile strength of from about 20 to about 500 MPa, in some embodiments from about 50 to about 400 MPa, and in some embodiments, from about 70 to about 350 MPa; a tensile break strain of about 0.4% or more, in some embodiments from about 0.5% to about 10%, and in some embodiments, from about 0.6% to about 3.5%; and/or a tensile modulus of from about 5,000 MPa o about 20,000 MPa, in some embodiments from about 8,000 MPa to about 20,000 MPa, and in some embodiments, from about 10,000 MPa to about 20,000 MPa. The tensile properties may be determined at a temperature of 23° C. in accordance with ISO Test No. 527:2012. The polymer composition may also exhibit a flexural strength of from about 20 to about 500 MPa, in some embodiments from about 50 to about 400 MPa, and in some embodiments, from about 100 to about 350 MPa; a flexural elongation of about 0.4% or more, in some embodiments from about 0.5% to about 10%, and in some embodiments, from about 0.6% to about 3.5%; and/or a flexural modulus of from about 5,000

MPa o about 20,000 MPa, in some embodiments from about 8,000 MPa to about 20,000 MPa, and in some embodiments, from about 10,000 MPa to about 15,000 MPa. The flexural properties may be determined at a temperature of 23° C. in accordance with 178:2010. Furthermore, the polymer composition may also possess a high impact strength, which may be useful when forming thin articles. The polymer composition may, for instance, possess a Charpy notched impact strength of about 3 kJ/m² or more, in some embodiments about 5 kJ/m² or more, in some embodiments about 7 kJ/m² or more, in some embodiments from about 8 kJ/m² to about 40 kJ/m², and in some embodiments from about 10 kJ/m² to about 25 kJ/m². The impact strength may be determined at a temperature of 23° C. in accordance with ISO Test No. ISO 179-1:2010.

As a result of the properties noted above, the polymer composition can be readily shaped into a substrate that can be subsequently applied with one or more conductive elements using a laser direct structuring process ("LDS"). Due to the beneficial properties of the polymer composition, the resulting substrate may have a very small size, such as a thickness of about 5 millimeters or less, in some embodiments about 4 millimeters or less, and in some embodiments, from about 0.5 to about 3 millimeters. If desired, the conductive elements may be antennas (e.g., antenna resonating elements) so that the resulting part is an antenna structure that may be employed in a wide variety of different electronic components, such as cellular telephones, automotive equipment, etc.

Various embodiments of the present invention will now be described in more detail.

I. Polymer Composition

A. Liquid Crystalline Polymer

The polymer composition contains one or more liquid crystalline polymers, which are generally classified as "thermotropic" to the extent that they can possess a rod-like structure and exhibit a crystalline behavior in their molten state (e.g., thermotropic nematic state). The liquid crystalline polymers employed in the polymer composition typically have a melting temperature of from about 200° C. to about 400° C., in some embodiments from about 250° C. to about 380° C., in some embodiments from about 270° C. to about 360° C., and in some embodiments from about 300° C. to about 350° C. The melting temperature may be determined as is well known in the art using differential scanning calorimetry ("DSC"), such as determined by ISO Test No. 11357-3:2011. Such polymers may be formed from one or more types of repeating units as is known in the art. A liquid crystalline polymer may, for example, contain one or more aromatic ester repeating units generally represented by the following Formula (I):

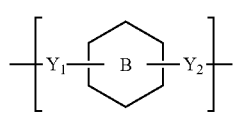
(I)

wherein,
ring B is a substituted or unsubstituted 6-membered aryl group (e.g., 1,4-phenylene or 1,3-phenylene), a substituted or unsubstituted 6-membered aryl group fused to a substituted or unsubstituted 5- or 6-membered aryl group (e.g., 2,6-naphthalene), or a substituted or unsubstituted 6-membered aryl group linked to a substituted or unsubstituted 5- or 6-membered aryl group (e.g., 4,4-biphenylene); and $Y_1$ and $Y_2$ are independently O, C(O), NH, C(O)HN, or NHC(O).

Typically, at least one of $Y_1$ and $Y_2$ are C(O). Examples of such aromatic ester repeating units may include, for instance, aromatic dicarboxylic repeating units ($Y_1$ and $Y_2$ in Formula I are C(O)), aromatic hydroxycarboxylic repeating units ($Y_1$ is O and $Y_2$ is C(O) in Formula I), as well as various combinations thereof.

Aromatic hydroxycarboxylic repeating units, for instance, may be employed that are derived from aromatic hydroxycarboxylic acids, such as, 4-hydroxybenzoic acid; 4-hydroxy-4'-biphenylcarboxylic acid; 2-hydroxy-6-naphthoic acid; 2-hydroxy-5-naphthoic acid; 3-hydroxy-2-naphthoic acid; 2-hydroxy-3-naphthoic acid; 4'-hydroxyphenyl-4-benzoic acid; 3'-hydroxyphenyl-4-benzoic acid; 4'-hydroxyphenyl-3-benzoic acid, etc., as well as alkyl, alkoxy, aryl and halogen substituents thereof, and combination thereof. Particularly suitable aromatic hydroxycarboxylic acids are 4-hydroxybenzoic acid ("HBA") and 6-hydroxy-2-naphthoic acid ("HNA"). When employed, repeating units derived from hydroxycarboxylic acids (e.g., HBA and/or HNA) typically constitute about 20 mol. % or more, in some embodiments about 25 mole % or more, in some embodiments from about 30 mol. % to 100 mol. %, and in some embodiments, from about 30 mol. % to about 60 mol. % of the polymer.

Aromatic dicarboxylic repeating units may also be employed that are derived from aromatic dicarboxylic acids, such as terephthalic acid, isophthalic acid, 2,6-naphthalenedicarboxylic acid, diphenyl ether-4,4'-dicarboxylic acid, 1,6-naphthalenedicarboxylic acid, 2,7-naphthalenedicarboxylic acid, 4,4'-dicarboxybiphenyl, bis(4-carboxyphenyl) ether, bis(4-carboxyphenyl)butane, bis(4-carboxyphenyl)ethane, bis(3-carboxyphenyl)ether, bis(3-carboxyphenyl)ethane, etc., as well as alkyl, alkoxy, aryl and halogen substituents thereof, and combinations thereof. Particularly suitable aromatic dicarboxylic acids may include, for instance, terephthalic acid ("TA"), isophthalic acid ("IA"), and 2,6-naphthalenedicarboxylic acid ("NDA"). When employed, repeating units derived from aromatic dicarboxylic acids (e.g., IA, TA, and/or NDA) each typically constitute from about 1 mol. % to about 40 mol. %, in some embodiments from about 2 mol. % to about 30 mol. %, and in some embodiments, from about 5 mol. % to about 25% of the polymer.

Other repeating units may also be employed in the polymer. In certain embodiments, for instance, repeating units may be employed that are derived from aromatic diols, such as hydroquinone, resorcinol, 2,6-dihydroxynaphthalene, 2,7-dihydroxynaphthalene, 1,6-dihydroxynaphthalene, 4,4'-dihydroxybiphenyl (or 4,4'-biphenol), 3,3'-dihydroxybiphenyl, 3,4'-dihydroxybiphenyl, 4,4'-dihydroxybiphenyl ether, bis(4-hydroxyphenyl)ethane, etc., as well as alkyl, alkoxy, aryl and halogen substituents thereof, and combinations thereof. Particularly suitable aromatic diols may include, for instance, hydroquinone ("HQ") and 4,4'-biphenol ("BP"). When employed, repeating units derived from aromatic diols (e.g., HQ and/or BP) each typically constitute from about 1 mol. % to about 50 mol. %, in some embodiments from about 2 mol. % to about 40 mol. %, and in some embodiments, from about 5 mol. % to about 35% of the polymer. Repeating units may also be employed, such as those derived from aromatic amides (e.g., acetaminophen ("APAP")) and/or aromatic amines (e.g., 4-aminophenol ("AP"), 3-aminophenol, 1,4-phenylenediamine, 1,3-phenylenediamine, etc.). When employed, repeating units derived from aromatic amides (e.g., APAP) and/or aromatic amines (e.g., AP) typically constitute from about 0.1 mol. % to about 20 mol. %, in some embodiments from about 0.5 mol. % to about 15 mol. %, and in some embodiments, from about 1 mol. % to about 10% of the polymer. It should also be understood that various other monomeric repeating units may be incorporated into the polymer. For instance, in certain embodiments, the polymer may contain one or more repeating units derived from non-aromatic monomers, such as aliphatic or cycloaliphatic hydroxycarboxylic acids, dicarboxylic acids, diols, amides, amines, etc. Of course, in other embodiments, the polymer may be "wholly aromatic" in that it lacks repeating units derived from non-aromatic (e.g., aliphatic or cycloaliphatic) monomers.

As indicated above, the liquid crystalline polymer is typically a "high naphthenic" polymer to the extent that it contains a relatively high content of repeating units derived from naphthenic hydroxycarboxylic acids and naphthenic dicarboxylic acids, such as NDA, HNA, or combinations thereof. That is, the total amount of repeating units derived from naphthenic hydroxycarboxylic and/or dicarboxylic acids (e.g., NDA, HNA, or a combination of HNA and NDA) is typically about 10 mol. % or more, in some embodiments about 12 mol. % or more, in some embodiments about 15 mol. % or more, in some embodiments about 18 mol. % or more, in some embodiments about 30 mol. % or more, in some embodiments about 40 mol. % or more, in some embodiments about 45 mol. % or more, in some embodiments about 50 mol. % or more, in some embodiments about 60 mol. % or more, in some embodiments about 62 mol. % or more, in some embodiments about 68 mol. % or more, in some embodiments about 70 mol. % or more, and in some embodiments, from about 70 mol. % to about 80 mol. % of the polymer.

In one embodiment, for instance, the repeating units derived from HNA may constitute 30 mol. % or more, in some embodiments about 40 mol. % or more, in some embodiments about 45 mol. % or more, in some embodiments 50 mol. % or more, in some embodiments about 60 mol. % or more, in some embodiments about 62 mol. % or more, in some embodiments about 68 mol. % or more, in some embodiments about 70 mol. % or more, and in some embodiments, from about 70 mol. % to about 80 mol. % of the polymer. The liquid crystalline polymer may also contain various other monomers. For example, the polymer may contain repeating units derived from HBA in an amount of from about 10 mol. % to about 40 mol. %, and in some embodiments from about 15 mol. % to about 35 mol. %, and in some embodiments, from about 20 mol. % to about 30 mol. %. When employed, the molar ratio of HNA to HBA may be selectively controlled within a specific range to help achieve the desired properties, such as from about 0.1 to about 40, in some embodiments from about 0.5 to about 20, in some embodiments from about 0.8 to about 10, and in some embodiments, from about 1 to about 5. The polymer may also contain aromatic dicarboxylic acid(s) (e.g., IA and/or TA) in an amount of from about 1 mol. % to about 40 mol. %, and in some embodiments, from about 5 mol. % to about 25 mol. %; and/or aromatic diol(s) (e.g., BP and/or HQ) in an amount of from about 1 mol. % to about 40 mol. %, and in some embodiments, from about 5 mol. % to about 25 mol. %. In some cases, however, it may be desired to minimize the presence of such monomers in the polymer to help achieve the desired properties. For example, the total amount of aromatic dicarboxylic acid(s) (e.g., IA and/or TA) may be about 20 mol % or less, in some embodiments about 15 mol. % or less, in some embodiments about 10 mol. % or less, in some embodiments, from 0 mol. % to about 5 mol. %, and in some embodiments, from 0 mol. % to about 2 mol. % of the polymer. Similarly, the total amount of aromatic dicarboxylic acid(s) (e.g., IA and/or TA) may be about 20 mol % or less, in some embodiments about 15 mol. % or less, in some embodiments about 10 mol. % or less, in some embodiments, from 0 mol. % to about 5 mol. %, and in some embodiments, from 0 mol. % to about 2 mol. % of the polymer (e.g., 0 mol. %).

In another embodiment, the repeating units derived from NDA may constitute 10 mol. % or more, in some embodiments about 12 mol. % or more, in some embodiments about 15 mol. % or more, and in some embodiments, from about 18 mol. % to about 95 mol. % of the polymer. In such embodiments, the liquid crystalline polymer may also contain various other monomers, such as aromatic hydroxycarboxylic acid(s) (e.g., HBA) in an amount of from about 20 mol. % to about 60 mol. %, and in some embodiments, from about 30 mol. % to about 50 mol. %; aromatic dicarboxylic acid(s) (e.g., IA and/or TA) in an amount of from about 2 mol. % to about 30 mol. %, and in some embodiments, from about 5 mol. % to about 25 mol. %; and/or aromatic diol(s) (e.g., BP and/or HQ) in an amount of from about 2 mol. % to about 40 mol. %, and in some embodiments, from about 5 mol. % to about 35 mol. %.

Generally speaking, the total amount of liquid crystalline polymers employed in the polymer composition is from about 40 wt. % to about 99.5 wt. %, in some embodiments from about 50 wt. % to about 99 wt. %, in some embodiments, from about 60 wt. % to about 98 wt. %, and in some embodiments, from about 70 wt. % to about 95 wt. % of the polymer composition. In certain embodiments, all of the liquid crystalline polymers are "high naphthenic" polymers such as described above. In other embodiments, however, "low naphthenic" liquid crystalline polymers may also be employed in the composition in which the total amount of repeating units derived from naphthenic hydroxycarboxylic and/or dicarboxylic acids (e.g., NDA, HNA, or a combination of HNA and NDA) is less than 10 mol. %, in some embodiments about 8 mol. % or less, in some embodiments about 6 mol. % or less, and in some embodiments, from about 1 mol. % to about 5 mol. % of the polymer. When employed, it is generally desired that such low naphthenic polymers are present in only a relatively low amount. For example, when employed, low naphthenic liquid crystalline polymers typically constitute from about 1 wt. % to about 50 wt. %, in some embodiments from about 2 wt. % to about 40 wt. %, and in some embodiments, from about 5 wt. % to about 30 wt. % of the total amount of liquid crystalline polymers in the composition, and from about 0.5 wt. % to about 45 wt. %, in some embodiments from about 2 wt. % to about 35 wt. %, and in some embodiments, from about 5 wt. % to about 25 wt. % of the entire composition. Conversely, high naphthenic liquid crystalline polymers typically constitute from about 50 wt. % to about 99 wt. %, in some embodiments from about 60 wt. % to about 98 wt. %, and in some embodiments, from about 70 wt. % to about 95 wt. % of the total amount of liquid crystalline polymers in the composition, and from about 55 wt. % to about 99.5 wt. %, in some embodiments from about 65 wt. % to about 98 wt. %, and in some embodiments, from about 75 wt. % to about 95 wt. % of the entire composition.

B. Laser Activatable Additive

The polymer composition is "laser activatable" in the sense that it contains an additive that can be activated by a laser direct structuring ("LDS") process. In such a process, the additive is exposed to a laser that causes the release of metals. The laser thus draws the pattern of conductive elements onto the part and leaves behind a roughened surface containing embedded metal particles. These particles act as nuclei for the crystal growth during a subsequent plating process (e.g., copper plating, gold plating, nickel plating, silver plating, zinc plating, tin plating, etc.). Laser activatable additives typically constitute from about 0.1 wt. % to about 20 wt. %, in some embodiments from about 0.5 wt. % to about 15 wt. %, and in some embodiments, from about 1 wt. % to about 10 wt. % of the polymer composition. The laser activatable additive generally includes spinel crystals, which may include two or more metal oxide cluster configurations within a definable crystal formation. For example, the overall crystal formation may have the following general formula:

$$AB_2O_4$$

wherein,

A is a metal cation having a valance of 2, such as cadmium, chromium, manganese, nickel, zinc, copper, cobalt, iron, magnesium, tin, titanium, etc., as well as combinations thereof; and B is a metal cation having a valance of 3, such as chromium, iron, aluminum, nickel, manganese, tin, etc., as well as combinations thereof.

Typically, A in the formula above provides the primary cation component of a first metal oxide cluster and B provides the primary cation component of a second metal oxide cluster. These oxide clusters may have the same or different structures. In one embodiment, for example, the first metal oxide cluster has a tetrahedral structure and the second metal oxide cluster has an octahedral cluster. Regardless, the clusters may together provide a singular identifiable crystal type structure having heightened susceptibility to electromagnetic radiation. Examples of suitable spinel crystals include, for instance, $MgAl_2O_4$, $ZnAl_2O_4$, $FeAl_2O_4$, $CuFe_2O_4$, $CuCr_2O_4$, $MnFe_2O_4$, $NiFe_2O_4$, $TiFe_2O_4$, $FeCr_2O_4$, $MgCr_2O_4$, etc. Copper chromium oxide ($CuCr_2O_4$) is particularly suitable for use in the present invention and is available from Shepherd Color Co. under the designation "Shepherd Black 1GM."

C. Fibrous Filler

A fibrous filler may also be employed in the polymer composition to improve the thermal and mechanical properties of the composition without having a significant impact on electrical performance. The fibrous filler typically includes fibers having a high degree of tensile strength relative to their mass. For example, the ultimate tensile strength of the fibers (determined in accordance with ASTM D2101) is typically from about 1,000 to about 15,000 Megapascals ("MPa"), in some embodiments from about 2,000 MPa to about 10,000 MPa, and in some embodiments, from about 3,000 MPa to about 6,000 MPa. To help maintain the desired dielectric properties, such high strength fibers may be formed from materials that are generally insulative in nature, such as glass, ceramics (e.g., alumina or silica), aramids (e.g., Kevlar® marketed by E. I. duPont de Nemours, Wilmington, Del.), polyolefins, polyesters, etc. Glass fibers are particularly suitable, such as E-glass, A-glass, C-glass, D-glass, AR-glass, R-glass, S1-glass, S2-glass, etc.

Further, although the fibers employed in the fibrous filler may have a variety of different sizes, fibers having a certain aspect ratio can help improve the mechanical properties of the resulting polymer composition. That is, fibers having an aspect ratio (average length divided by nominal diameter) of about 2 or more, in some embodiments about 4 or more, in some embodiments from about 5 to about 50, and in some embodiments, from about 8 to about 40 are particularly beneficial. Such fibrous fillers may, for instance, have a weight average length of about 10 micrometer or more, in some embodiments about 25 micrometers or more, in some embodiments from about 50 micrometers or more to about 800 micrometers or less, and in some embodiments from about 60 micrometers to about 500 micrometers. Also, such fibrous fillers may, for instance, have a volume average length of about 10 micrometer or more, in some embodiments about 25 micrometers or more, in some embodiments from about 50 micrometers or more to about 800 micrometers or less, and in some embodiments from about 60 micrometers to about 500 micrometers. The fibrous fillers may likewise have a nominal diameter of about 5 micrometers or more, in some embodiments about 6 micrometers or more, in some embodiments from about 8 micrometers to about 40 micrometers, and in some embodiments from about 9 micrometers to about 20 micrometers. The relative amount of the fibrous filler may also be selectively controlled to help achieve the desired mechanical and thermal properties without adversely impacting other properties of the composition, such as its flowability and dielectric properties, etc. For example, the fibrous filler may be employed in a sufficient amount so that the weight ratio of the fibrous filler to the laser activatable additive is from about 1 to about 5, in some embodiments from about 1.5 about 4.5, and in some embodiments from about 2 to about 3.5. The fibrous filler may, for instance, constitute from about 1 wt. % to about 40 wt. %, in some embodiments from about 3 wt. % to about 30 wt. %, and in some embodiments, from about 5 wt. % to about 20 wt. % of the polymer composition.

D. Hydrophobic Material

If desired, an additional hydrophobic material may be employed in the polymer composition to help further reduce its tendency to absorb water, which can help stabilize the dielectric constant and dissipation factor at high frequency ranges. When employed, the weight ratio of liquid crystalline polymer(s) to hydrophobic material(s) is typically from about 1 to about 20, in some embodiments from about 2 to about 15, and in some embodiments, from about 3 to about 10. For example, the hydrophobic material may constitute from about 1 wt. % to about 60 wt. %, in some embodiments from about 2 wt. % to about 50 wt. %, and in some embodiments, from about 5 wt. % to about 40 wt. % of the entire polymer composition.

Particularly suitable hydrophobic materials are low surface energy elastomers, such as fluoropolymers, silicone polymers, etc. Fluoropolymers, for instance, may contains a hydrocarbon backbone polymer in which some or all of the hydrogen atoms are substituted with fluorine atoms. The backbone polymer may polyolefinic and formed from fluorine-substituted, unsaturated olefin monomers. The fluoropolymer can be a homopolymer of such fluorine-substituted monomers or a copolymer of fluorine-substituted monomers or mixtures of fluorine-substituted monomers and non-fluorine-substituted monomers. Along with fluorine atoms, the fluoropolymer can also be substituted with other halogen atoms, such as chlorine and bromine atoms. Representative monomers suitable for forming fluoropolymers for use in this invention are tetrafluoroethylene ("TFE"), vinylidene fluoride ("VF2"), hexafluoropropylene ("HFP"), chlorotrifluoroethylene ("CTFE"), perfluoroethylvinyl ether ("PEVE"), perfluoromethylvinyl ether ("PMVE"), perfluoropropylvinyl ether ("PPVE"), etc., as well as mixtures thereof. Specific examples of suitable fluoropolymers include polytetrafluoroethylene ("PTFE"), perfluoroalkylvinyl ether ("PVE"), poly(tetrafluoroethylene-co-perfluoroalkyvinyl ether) ("PFA"), fluorinated ethylene-propylene copolymer ("FEP"), ethylene-tetrafluoroethylene copolymer ("ETFE"), polyvinylidene fluoride ("PVDF"), polychlorotrifluoroethylene ("PCTFE"), and TFE copolymers with VF2 and/or HFP, etc., as well as mixtures thereof.

In certain embodiments, the hydrophobic material (e.g., fluoropolymer) may have a particle size that is selectively controlled to help form films of a relatively low thickness. For example, the hydrophobic material may have a median particle size (e.g., diameter) of about 1 to about 60 micrometers, in some embodiments from about 2 to about 55 micrometers, in some embodiments from about 3 to about 50 micrometers, and in some embodiments, from about 25 to about 50 micrometers, such as determined using laser diffraction techniques in accordance with ISO 13320:2009 (e.g., with a Horiba LA-960 particle size distribution analyzer). The hydrophobic material may also have a narrow size distribution. That is, at least about 70% by volume of the particles, in some embodiments at least about 80% by volume of the particles, and in some embodiments, at least about 90% by volume of the particles may have a size within the ranges noted above.

E. Hollow Filler

Although by no means required, the polymer composition may also include one or more hollow inorganic fillers to help achieve the desired dielectric constant. For instance, such fillers may have a dielectric constant of about 3.0 or less, in some embodiments about 2.5 or less, in some embodiments from about 1.1 to about 2.3, and in some embodiments from about 1.2 to about 2.0 at 100 MHz. The hollow inorganic fillers typically have an interior hollow space or cavity and may be synthesized using techniques known in the art. The hollow inorganic fillers may be made from conventional materials. For instance, the hollow inorganic fillers may include alumina, silica, zirconia, magnesia, glass, fly ash, borate, phosphate, ceramic, and the like. In one embodiment, the hollow inorganic fillers may include hollow glass fillers, hollow ceramic fillers, and mixtures thereof. In one embodiment, the hollow inorganic fillers include hollow glass fillers. The hollow glass fillers may be made from a soda lime borosilicate glass, a soda lime glass, a borosilicate glass, a sodium borosilicate glass, a sodium silicate glass, or an aluminosilicate glass. In this regard, in one embodiment, the composition of the glass, while not limited, may be at least about 65% by weight of $SiO_2$, 3-15% by weight of $Na_2O$, 8-15% by weight of CaO, 0.1-5% by weight of MgO, 0.01-3% by weight of $Al_2O_3$, 0.01-1% by weight of $K_2O$, and optionally other oxides (e.g., $Li_2O$, $Fe_2O_3$, $TiO_2$, $B_2O_3$). In another embodiment, the composition may be about 50-58% by weight of $SiO_2$, 25-30% by weight of $Al_2O_3$, 6-10% by weight of CaO, 1-4% by weight of $Na_2O/K_2O$, and 1-5% by weight of other oxides. Also, in one embodiment, the hollow glass fillers may include more alkaline earth metal oxides than alkali metal oxides. For example, the weight ratio of the alkaline earth metal oxides to the alkali metal oxides may be more than 1, in some embodiments about 1.1 or more, in some embodiments about 1.2 to about 4, and in some embodiments from about 1.5 to about 3. Regardless of the above, it should be understood that the glass composition may vary depending on the type of glass utilized and still provide the benefits as desired by the present invention.

The hollow inorganic fillers may have at least one dimension having an average value that is about 1 micrometers or more, in some embodiments about 5 micrometers or more, in some embodiments about 8 micrometers or more, in some embodiments from about 1 micrometer to about 150 micrometers, in some embodiments from about 10 micrometers to about 150 micrometers, and in some embodiments from about 12 micrometers to about 50 micrometers. In one embodiment, such average value may refer to a $d_{50}$ value. Furthermore, the hollow inorganic fillers may have a $D_{10}$ of about 3 micrometers or more, in some embodiments about 4 micrometers or more, in some embodiments from about 5 micrometers to about 20 micrometers, and in some embodiments from about 6 micrometers to about 15 micrometers. The hollow inorganic fillers may have a $D_{90}$ of about 10 micrometers or more, in some embodiments about 15 micrometers or more, in some embodiments from about 20 micrometers to about 150 micrometers, and in some embodiments from about 22 micrometers to about 50 micrometers. In this regard, the hollow inorganic fillers may be present in a size distribution, which may be a Gaussian, normal, or non-normal size distribution. In one embodiment, the hollow inorganic fillers may have a Gaussian size distribution. In another embodiment, the hollow inorganic fillers may have a normal size distribution. In a further embodiment, the hollow inorganic fillers may have a non-normal size distribution. Examples of non-normal size distributions may include unimodal and multi-modal (e.g., bimodal) size distributions. When referring to dimensions above, such dimension may be any dimension. In one embodiment, however, such dimension refers to a diameter. For example, such value for the dimension refers to an average diameter of spheres. The dimension, such as the average diameter, may be determined in accordance to 3M QCM 193.0. In this regard, in one embodiment, the hollow inorganic fillers may be referring to hollow spheres such as hollow glass spheres. For instance, the hollow inorganic fillers may have an average aspect ratio of approximately 1. In general, the average aspect ratio may be about 0.8 or more, in some embodiments about 0.85 or more, in some embodiments from about 0.9 to about 1.3, and in some embodiments from about 0.95 to about 1.05.

In addition, the hollow inorganic fillers may have relatively thin walls to help with the dielectric properties of the polymer composition as well as the reduction in weight. The thickness of the wall may be about 50% or less, in some embodiments about 40% or less, in some embodiments from about 1% to about 30%, and in some embodiments from about 2% to about 25% the average dimension, such as the average diameter, of the hollow inorganic fillers. In addition, the hollow inorganic fillers may have a certain true density that can allow for easy handling and provide a polymer composition having a reduction in weight. In general, the true density refers to the quotient obtained by dividing the mass of a sample of the hollow fillers by the true volume of that mass of hollow fillers wherein the true volume is referred to as the aggregate total volume of the hollow fillers. In this regard, the true density of the hollow inorganic fillers may be about 0.1 $g/cm^3$ or more, in some embodiments about 0.2 $g/cm^3$ or more, in some embodiments from about 0.3 $g/cm^3$ or more to about 1.2 $g/cm^3$, and in some embodiments from about 0.4 $g/cm^3$ or more to about 0.9 $g/cm^3$. The true density may be determined in accordance to 3M QCM 14.24.1.

Even though the fillers are hollow, they may have a mechanical strength that allows for maintaining the integrity of the structure of the fillers resulting in a lower likelihood of the fillers being broken during processing and/or use. In this regard, the isotactic crush resistance (i.e., wherein at least 80 vol. %, such as at least 90 vol. % of the hollow fillers survive) of the hollow inorganic fillers may be about 20 MPa or more, in some embodiments about 100 MPa or more, in some embodiments from about 150 MPa to about 500 MPa, and in some embodiments from about 200 MPa to about 350 MPa. The isotactic crush resistance may be determined in accordance to 3M QCM 14.1.8.

The alkalinity of the hollow inorganic fillers may be about 1.0 meq/g or less, in some embodiments about 0.9 meq/g or less, in some embodiments from about 0.1 meq/g to about 0.8 meq/g, and in some embodiments from about 0.2 meq/g to about 0.7 meq/g. The alkalinity may be determined in accordance to 3M QCM 55.19. In order to provide a relatively low alkalinity, the hollow inorganic fillers may be treated with a suitable acid, such as a phosphoric acid. In addition, the hollow inorganic fillers may also include a surface treatment to assist with providing a better compatibility with the polymer and/or other components within the polymer composition. As an example, the surface treatment may be a silanization. In particular, the surface treatment agents may include, but are not limited to, aminosilanes, epoxysilanes, etc.

When employed, the hollow inorganic fillers may, for instance, constitute about 1 wt. % or more, in some embodiments about 4 wt. % or more, in some embodiments from about 5 wt. % to about 40 wt. %, and in some embodiments from about 10 wt. % to about 30 wt. % of the polymer composition.

F. Particulate Filler

If desired, a particulate filler may be employed for improving certain properties of the polymer composition. The particulate filler may be employed in the polymer composition in an amount of from about 5 to about 60 parts, in some embodiments from about 10 to about 50 parts, and in some embodiments, from about 15 to about 40 parts by weight per 100 parts of the liquid crystalline polymer(s) employed in the polymer composition. For instance, the particulate filler may constitute from about 5 wt. % to about 50 wt. %, in some embodiments from about 10 wt. % to about 40 wt. %, and in some embodiments, from about 15 wt. % to about 30 wt. % of the polymer composition.

In certain embodiments, particles may be employed that have a certain hardness value to help improve the surface properties of the composition. For instance, the hardness values may be about 2 or more, in some embodiments about 2.5 or more, in some embodiments from about 3 to about 11, in some embodiments from about 3.5 to about 11, and in some embodiments, from about 4.5 to about 6.5 based on the Mohs hardness scale. Examples of such particles may include, for instance, silica (Mohs hardness of 7), mica (e.g., Mohs hardness of about 3); carbonates, such as calcium carbonate ($CaCO_3$, Mohs hardness of 3.0) or a copper carbonate hydroxide ($Cu_2CO3(OH)_2$, Mohs hardness of 4.0); fluorides, such as calcium fluoride ($CaFl_2$, Mohs hardness of 4.0); phosphates, such as calcium pyrophosphate (($Ca_2P_2O_7$, Mohs hardness of 5.0), anhydrous dicalcium phosphate ($CaHPO_4$, Mohs hardness of 3.5), or hydrated aluminum phosphate ($AlPO_4 \cdot 2H2O$, Mohs hardness of 4.5); borates, such as calcium borosilicate hydroxide ($Ca_2B_5SiO_9$ $(OH)_5$, Mohs hardness of 3.5); alumina ($AlO_2$, Mohs hardness of 10.0); sulfates, such as calcium sulfate ($CaSO_4$, Mohs hardness of 3.5) or barium sulfate ($BaSO_4$, Mohs hardness of from 3 to 3.5); and so forth, as well as combinations thereof.

The shape of the particles may vary as desired. For instance, flake-shaped particles may be employed in certain embodiments that have a relatively high aspect ratio (e.g., average diameter divided by average thickness), such as about 10:1 or more, in some embodiments about 20:1 or more, and in some embodiments, from about 40:1 to about 200:1. The average diameter of the particles may, for example, range from about 5 micrometers to about 200 micrometers, in some embodiments from about 30 micrometers to about 150 micrometers, and in some embodiments, from about 50 micrometers to about 120 micrometers, such as determined using laser diffraction techniques in accordance with ISO 13320:2009 (e.g., with a Horiba LA-960 particle size distribution analyzer). Suitable flaked-shaped particles may be formed from a natural and/or synthetic silicate mineral, such as mica, halloysite, kaolinite, illite, montmorillonite, vermiculite, palygorskite, pyrophyllite, calcium silicate, aluminum silicate, wollastonite, etc. Mica, for instance, is particularly suitable. Any form of mica may generally be employed, including, for instance, muscovite ($KAI_2(AlSi_3)O_{10}(OH)_2$), biotite ($K(Mg,Fe)_3(AlSi_3)O_{10}$ $(OH)_2$), phlogopite ($KMg_3(AlSi_3)O_{10}(OH)_2$), lepidolite ($K(Li,Al)_{2-3}(AlSi_3)O_{10}(OH)_2$), glauconite ($K,Na)(Al,Mg, Fe)_2(Si,Al)_4O_{10}(OH)_2$), etc. Granular particles may also be employed. Typically, such particles have an average diameter of from about 0.1 to about 10 micrometers, in some embodiments from about 0.2 to about 4 micrometers, and in some embodiments, from about 0.5 to about 2 micrometers, such as determined using laser diffraction techniques in accordance with ISO 13320:2009 (e.g., with a Horiba LA-960 particle size distribution analyzer). Particularly suitable granular fillers may include, for instance, talc, barium sulfate, calcium sulfate, calcium carbonate, etc.

The particulate filler may be formed primarily or entirely from one type of particle, such as flake-shaped particles (e.g., mica) or granular particles (e.g., barium sulfate). That is, such flaked-shaped or granular particles may constitute about 50 wt. % or more, and in some embodiments, about 75 wt. % or more (e.g., 100 wt. %) of the particulate filler. Of course, in other embodiments, flake-shaped and granular particles may also be employed in combination. In such embodiments, for example, flake-shaped particles may constitute from about 0.5 wt. % to about 20 wt. %, and in some embodiments, from about 1 wt. % to about 10 wt. % of the particulate filler, while the granular particles constitute from about 80 wt. % to about 99.5 wt. %, and in some embodiments, from about 90 wt. % to about 99 wt. % of the particulate filler.

If desired, the particles may also be coated with a fluorinated additive to help improve the processing of the composition, such as by providing better mold filling, internal lubrication, mold release, etc. The fluorinated additive may include a fluoropolymer, which contains a hydrocarbon backbone polymer in which some or all of the hydrogen atoms are substituted with fluorine atoms. The backbone polymer may polyolefinic and formed from fluorine-substituted, unsaturated olefin monomers. The fluoropolymer can be a homopolymer of such fluorine-substituted monomers or a copolymer of fluorine-substituted monomers or mixtures of fluorine-substituted monomers and non-fluorine-substituted monomers. Along with fluorine atoms, the fluoropolymer can also be substituted with other halogen atoms, such as chlorine and bromine atoms. Representative monomers suitable for forming fluoropolymers for use in this invention are tetrafluoroethylene, vinylidene fluoride, hexafluoropropylene, chlorotrifluoroethylene, perfluoroethylvinyl ether, perfluoromethylvinyl ether, perfluoropropylvinyl ether, etc., as well as mixtures thereof. Specific examples of suitable fluoropolymers include polytetrafluoroethylene, perfluoroalkylvinyl ether, poly(tetrafluoroethylene-co-perfluoroalkyvinylether), fluorinated ethylene-propylene copolymer, ethylene-tetrafluoroethylene copolymer, polyvinylidene fluoride, polychlorotrifluoroethylene, etc., as well as mixtures thereof.

G. Other Additives

A wide variety of additional additives can also be included in the polymer composition, such as lubricants, thermally conductive fillers, pigments, antioxidants, stabilizers, surfactants, waxes, flame retardants, anti-drip additives, nucleating agents (e.g., boron nitride), flow modifiers (e.g., aluminum trihydroxide), dielectric material, and other materials added to enhance properties and processability. When employed, for example, lubricants and/or flow modifiers such may constitute from about 0.05 wt. % to about 5 wt. %, and in some embodiments, from about 0.1 wt. % to about 1 wt. % of the polymer composition.

In certain embodiments, a dielectric material may optionally be employed to help tune the dielectric constant to the desired range. The dielectric material typically has a volume resistivity of from about 0.1 ohm-cm to about $1 \times 10^{12}$ ohm-cm, in some embodiments about 0.5 ohm-cm to about $1 \times 10^{11}$ ohm-cm, in some embodiments from about 1 to about $1 \times 10^{10}$ ohm-cm, and in some embodiments, from about 2 to about $1 \times 10^{8}$ ohm-cm, such as determined at a temperature of about 20° C. in accordance with ASTM D257-14. This may be accomplished by selecting a single material having the desired volume resistivity, or by blending multiple materials together (e.g., insulative and electrically conductive) so that the resulting blend has the desired volume resistance. In one embodiment, for example, inorganic oxide materials may be employed that may exhibit a linear response of electrical charge (or polarization) versus voltage. These materials may exhibit a total reversible polarization of charge within the crystal structure after the applied electrical field is removed. Suitable inorganic oxide materials for this purpose may include, for instance, ferroelectric and/or paraelectric materials. Examples of suitable ferroelectric materials include, for instance, barium titanate ($BaTiO_3$), strontium titanate ($SrTiO_3$), calcium titanate ($CaTiO_3$), magnesium titanate ($MgTiO_3$), strontium barium titanate ($SrBaTiO_3$), sodium barium niobate ($NaBa_2Nb_5O_{15}$), potassium barium niobate ($KBa_2Nb_5O_{15}$), calcium zirconate ($CaZrO_3$), titanite ($CaTiSiO_5$), as well as combinations thereof. Examples of suitable paraelectric materials likewise include, for instance, titanium dioxide ($TiO_2$), tantalum pentoxide ($Ta_2O_5$), hafnium dioxide ($HfO_2$), niobium pentoxide ($Nb_2O_5$), alumina ($Al_2O_3$), zinc oxide ($ZnO$), etc., as well as combinations thereof. Particularly suitable inorganic oxide materials are particles that include $TiO_2$, $BaTiO_3$, $SrTiO_3$, $CaTiO_3$, $MgTiO_3$, $BaSrTi_2O_6$, and $ZnO$. Of course, other types of inorganic oxide materials (e.g., mica) may also be employed as a dielectric material. Carbon materials may likewise be employed, such as graphite, carbon black, etc.

Various techniques may be employed to help achieve the desired volume resistivity. In one embodiment, for instance, an inorganic oxide material may be employed that has a volume resistivity of from 0.1 ohm-cm to about 500 ohm-cm, in some embodiments about 0.5 ohm-cm to about 250 ohm-cm, in some embodiments from about 1 to about 100 ohm-cm, and in some embodiments, from about 2 to about 50 ohm-cm, such as determined at a temperature of about 20° C. in accordance with ASTM D257-14. In another embodiment, a carbon material may be employed that has a volume resistivity of from about $1 \times 10^{3}$ to about $1 \times 10^{12}$ ohm-cm, in some embodiments about $1 \times 10^{4}$ to about $1 \times 10^{11}$ ohm-cm, in some embodiments from about $1 \times 10^{5}$ to about $1 \times 10^{10}$ ohm-cm, and in some embodiments, from about $1 \times 10^{6}$ to about $1 \times 10^{8}$ ohm-cm, such as determined at a temperature of about 20° C. in accordance with ASTM D257-14.

Of course, as noted above, electrically conductive materials may also be employed in combination with an insulative material to help achieve the desired volume resistance for the dielectric material. The electrically conductive materials generally have a volume resistivity of less than about 0.1 ohm-cm, and in some embodiments, from about $1 \times 10^{-8}$ to about $1 \times 10^{-2}$ ohm-cm, and the insulative materials generally have a volume resistivity of greater than about $1 \times 10^{12}$ ohm-cm, and in some embodiments, from about $1 \times 10^{13}$ to about $1 \times 10^{18}$ ohm-cm. Suitable electrically conductive materials may include, for instance, electrically conductive carbon materials (e.g., graphite, carbon black, fibers, graphene, nanotubes, etc.), metals, etc. Suitable insulative materials may likewise include inorganic oxide materials (e.g., particles) as described above, such as titanium dioxide ($TiO_2$). When employed, the ratio of the weight percentage of the insulative material in the polymer composition to the weight percentage of the electrically conductive material in the composition may be from about 3 to about 100, in some embodiments from about 3 to about 50, in some embodiments from about 3 to about 20, in some embodiments from about 7 to about 18, and in some embodiments, from about 8 to about 15. For example, the electrically conductive material may constitute from about 1 wt. % to about 20 wt. %, in some embodiments from about 3 wt. % to about 18 wt. %, and in some embodiments, from about 5 wt. % to about 15 wt. % of the dielectric material, while the insulative material may constitute from about 80 wt. % to about 99 wt. %, in some embodiments 82 wt. % to about 97 wt. %, and in some embodiments, from about 85 wt. % to about 95 wt. % of the dielectric material.

Regardless of the materials employed, it is generally desired that the dielectric material is employed in only a relatively small concentration so that the polymer composition is able to maintain the desired low dielectric constant. Thus, when employed, the dielectric material typically constitutes about 10 wt. % or less, in some embodiments about 5 wt. % or less, and in some embodiments, from about 0.001 wt. % to about 2 wt. % of the polymer composition. In fact, in certain embodiments, the polymer composition is generally free of such dielectric materials.

II. Formation

The components used to form the polymer composition may be combined together using any of a variety of different techniques as is known in the art. In one particular embodiment, for example, the liquid crystalline polymer, laser activatable additive, and other optional additives are melt processed as a mixture within an extruder to form the polymer composition. The mixture may be melt-kneaded in a single-screw or multi-screw extruder at a temperature of from about 250° C. to about 450° C. In one embodiment, the mixture may be melt processed in an extruder that includes multiple temperature zones. The temperature of individual zones is typically set within about −60° C. to about 25° C. relative to the melting temperature of the liquid crystalline polymer. By way of example, the mixture may be melt processed using a twin screw extruder such as a Leistritz 18-mm co-rotating fully intermeshing twin screw extruder. A general purpose screw design can be used to melt process the mixture. In one embodiment, the mixture including all of the components may be fed to the feed throat in the first barrel by means of a volumetric feeder. In another embodiment, different components may be added at different addition points in the extruder, as is known. For example, the liquid crystalline polymer may be applied at the feed throat, and certain additives (e.g., dielectric material, laser activatable additive, and optional fibrous filler) may be supplied at the same or different temperature zone located downstream therefrom. Regardless, the resulting mixture can be melted and mixed then extruded through a die. The extruded polymer composition can then be quenched in a water bath to solidify and granulated in a pelletizer followed by drying.

The melt viscosity of the resulting composition is generally low enough that it can readily flow into the cavity of a mold to form a small-sized circuit substrate. For example, in one particular embodiment, the polymer composition may have a melt viscosity of about 500 Pa-s or less, in some embodiments about 250 Pa-s or less, in some embodiments from about 5 Pa-s to about 150 Pa-s, in some embodiments from about 5 Pa-s to about 100 Pa-s, in some embodiments from about 10 Pa-s to about 100 Pa-s, in some embodiments from about 15 to about 90 Pa-s, as determined at a shear rate of 1,000 seconds$^{-1}$, as determined at a shear rate of 1,000 seconds$^{-1}$. Melt viscosity may be determined in accordance with 11443:2005.

III. Substrate

Once formed, the polymer composition may be molded into the desired shape of a substrate for use in an antenna system. Due to the beneficial properties of the polymer composition, the resulting substrate may have a very small size, such as a thickness of about 5 millimeters or less, in some embodiments about 4 millimeters or less, and in some embodiments, from about 0.5 to about 3 millimeters. Typically, the shaped parts are molded using a one-component injection molding process in which dried and preheated plastic granules are injected into the mold. The conductive elements may be formed in a variety of ways, such as by plating, electroplating, laser direct structuring, etc. When containing spinel crystals as a laser activatable additive, for instance, activation with a laser may cause a physio-chemical reaction in which the spinel crystals are cracked open to release metal atoms. These metal atoms can act as a nuclei for metallization (e.g., reductive copper coating). The laser also creates a microscopically irregular surface and ablates the polymer matrix, creating numerous microscopic pits and undercuts in which the copper can be anchored during metallization.

If desired, the conductive elements may be antenna elements (e.g., antenna resonating elements) so that the resulting part forms an antenna system. The conductive elements can form antennas of a variety of different types, such as antennae with resonating elements that are formed from patch antenna elements, inverted-F antenna elements, closed and open slot antenna elements, loop antenna elements, monopoles, dipoles, planar inverted-F antenna elements, hybrids of these designs, etc. The resulting antenna system can be employed in a variety of different electronic components. As an example, the antenna system may be formed in electronic components, such as desktop computers, portable computers, handheld electronic devices, automotive equipment, etc. In one suitable configuration, the antenna system is formed in the housing of a relatively compact portable electronic component in which the available interior space is relatively small. Examples of suitable portable electronic components include cellular telephones, laptop computers, small portable computers (e.g., ultraportable computers, netbook computers, and tablet computers), wrist-watch devices, pendant devices, headphone and earpiece devices, media players with wireless communications capabilities, handheld computers (also sometimes called personal digital assistants), remote controllers, global positioning system (GPS) devices, handheld gaming devices, etc. The antenna could also be integrated with other components such as camera module, speaker or battery cover of a handheld device.

Figure 2:
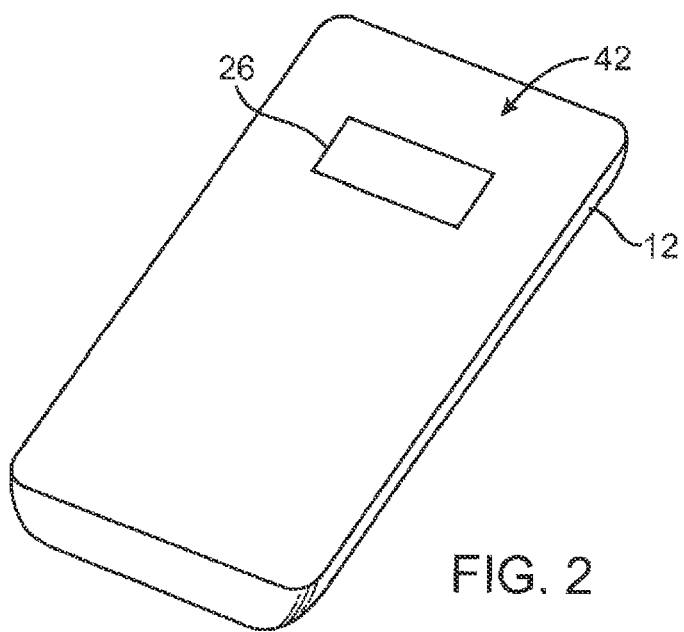
Figure 3:
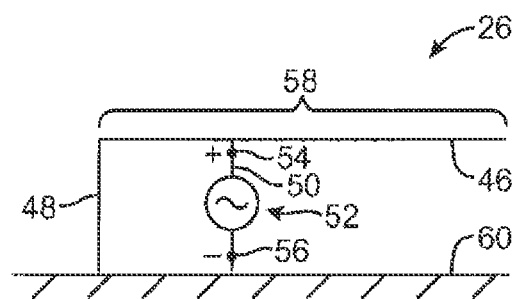
FIG. 3 is a top view of an illustrative inverted-F antenna resonating element for one embodiment of an antenna system.

One particularly suitable electronic component is shown in FIGS. 1-2 is a handheld device 10 with cellular telephone capabilities. As shown in FIG. 1, the device 10 may have a housing 12 formed from plastic, metal, other suitable dielectric materials, other suitable conductive materials, or combinations of such materials. A display 14 may be provided on a front surface of the device 10, such as a touch screen display. The device 10 may also have a speaker port 40 and other input-output ports. One or more buttons 38 and other user input devices may be used to gather user input. As shown in FIG. 2, an antenna system 26 is also provided on a rear surface 42 of device 10, although it should be understood that the antenna system can generally be positioned at any desired location of the device. The antenna system may be electrically connected to other components within the electronic device using any of a variety of known techniques. Referring again to FIGS. 1-2, for example, the housing 12 or a part of housing 12 may serve as a conductive ground plane for the antenna system 26. This is more particularly illustrated in FIG. 3, which shows the antenna system 26 as being fed by a radio-frequency source 52 at a positive antenna feed terminal 54 and a ground antenna feed terminal 56. The positive antenna feed terminal 54 may be coupled to an antenna resonating element 58, and the ground antenna feed terminal 56 may be coupled to a ground element 60. The resonating element 58 may have a main arm 46 and a shorting branch 48 that connects main arm 46 to ground 60.

Figure 4:
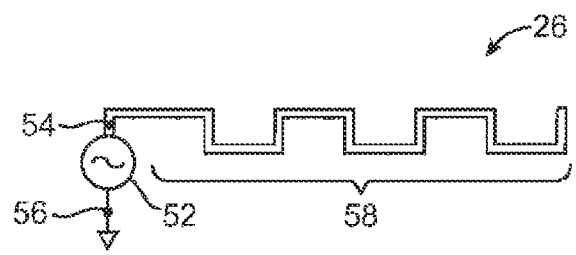
FIG. 4 is a top view of an illustrative monopole antenna resonating element for one embodiment of an antenna system.
Figure 5:
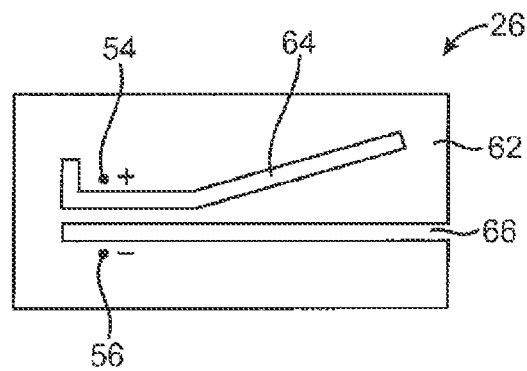
FIG. 5 is a top view of an illustrative slot antenna resonating element for one embodiment of an antenna system.
Figure 6:
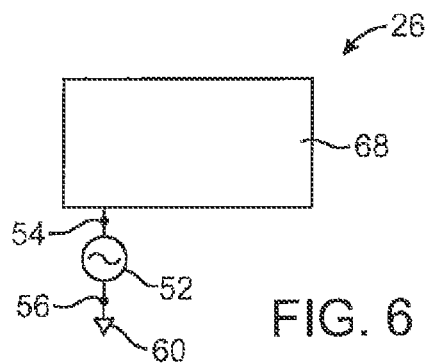
FIG. 6 is a top view of an illustrative patch antenna resonating element for one embodiment of an antenna system.
Figure 7:
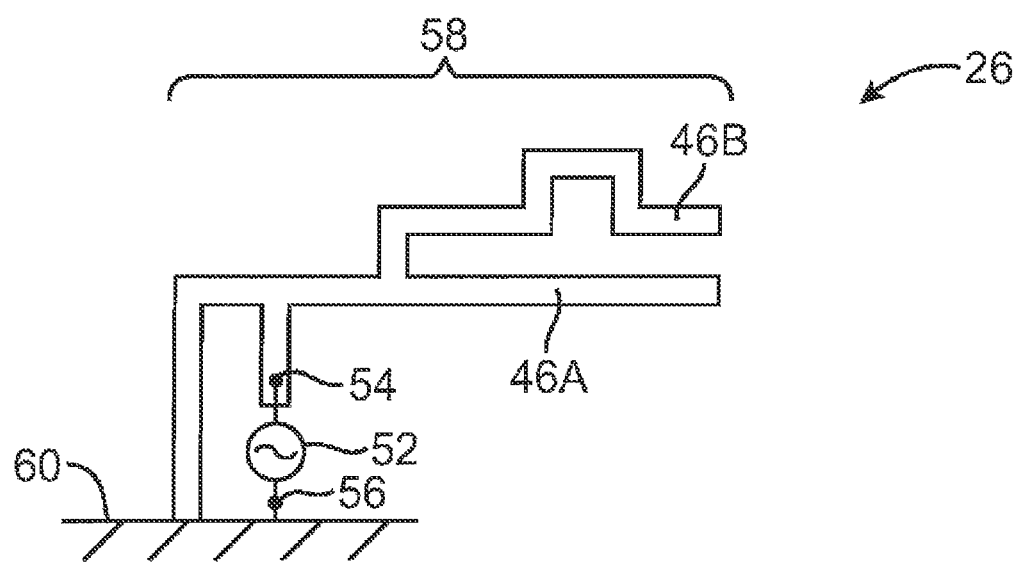
FIG. 7 is a top view of an illustrative multibranch inverted-F antenna resonating element for one embodiment of an antenna system.

Various other configurations for electrically connecting the antenna system are also contemplated. In FIG. 4, for instance, the antenna system is based on a monopole antenna configuration and the resonating element 58 has a meandering serpentine path shape. In such embodiments, the feed terminal 54 may be connected to one end of resonating element 58, and the ground feed terminal 56 may be coupled to housing 12 or another suitable ground plane element. In another embodiment as shown in FIG. 5, conductive antenna elements 62 are configured to define a closed slot 64 and an open slot 66. The antenna formed from structures 62 may be fed using positive antenna feed terminal 54 and ground antenna feed terminal 56. In this type of arrangement, slots 64 and 66 serve as antenna resonating elements for the antenna element 26. The sizes of the slots 64 and 66 may be configured so that the antenna element 26 operates in desired communications bands (e.g., 2.4 GHz and 5 GHz, etc.). Another possible configuration for the antenna system 26 is shown in FIG. 6. In this embodiment, the antenna element 26 has a patch antenna resonating element 68 and may be fed using positive antenna feed terminal 54 and ground antenna feed terminal 56. The ground 60 may be associated with housing 12 or other suitable ground plane elements in device 10. FIG. 7 shows yet another illustrative configuration that may be used for the antenna elements of the antenna system 26. As shown, antenna resonating element 58 has two main arms 46A and 46B. The arm 46A is shorter than the arm 46B and is therefore associated with higher frequencies of operation than the arm 46A. By using two or more separate resonating element structures of different sizes, the antenna resonating element 58 can be configured to cover a wider bandwidth or more than a single communications band of interest.

In certain embodiments of the present invention, the polymer composition may be particularly well suited for high frequency antennas and antenna arrays for use in base stations, repeaters (e.g., "femtocells"), relay stations, terminals, user devices, and/or other suitable components of 5G systems. As used herein, "5G" generally refers to high speed data communication over radio frequency signals. 5G networks and systems are capable of communicating data at much faster rates than previous generations of data communication standards (e.g., "4G, "LTE"). For example, as used herein, "5G frequencies" can refer to frequencies that are 1.5 GHz or more, in some embodiments about 2.0 GHz or more, in some embodiments about 2.5 GHz or higher, in some embodiments about 3.0 GHz or higher, in some embodiments from about 3 GHz to about 300 GHz, or higher, in some embodiments from about 4 GHz to about 80 GHz, in some embodiments from about 5 GHz to about 80 GHz, in some embodiments from about 20 GHz to about 80 GHz, and in some embodiments from about 28 GHz to about 60 GHz. Various standards and specifications have been released quantifying the requirements of 5G communications. As one example, the International Telecommunications Union (ITU) released the International Mobile Telecommunications-2020 ("IMT-2020") standard in 2015. The IMT-2020 standard specifies various data transmission criteria (e.g., downlink and uplink data rate, latency, etc.) for 5G. The IMT-2020 Standard defines uplink and downlink peak data rates as the minimum data rates for uploading and downloading data that a 5G system must support. The IMT-2020 standard sets the downlink peak data rate requirement as 20 Gbit/s and the uplink peak data rate as 10 Gbit/s. As another example, $3^{rd}$ Generation Partnership Project (3GPP) recently released new standards for 5G, referred to as "5G NR." 3GPP published "Release 15" in 2018 defining "Phase 1" for standardization of 5G NR. 3GPP defines 5G frequency bands generally as "Frequency Range 1" (FR1) including sub-6 GHz frequencies and "Frequency Range 2" (FR2) as frequency bands ranging from 20-60 GHz. Antenna systems described herein can satisfy or qualify as "5G" under standards released by 3GPP, such as Release 15 (2018), and/or the IMT-2020 Standard.

To achieve high speed data communication at high frequencies, antenna elements and arrays may employ small feature sizes/spacing (e.g., fine pitch technology) that can improve antenna performance. For example, the feature size (spacing between antenna elements, width of antenna elements) etc. is generally dependent on the wavelength ("$\lambda$") of the desired transmission and/or reception radio frequency propagating through the substrate dielectric on which the antenna element is formed (e.g., $n\lambda/4$ where n is an integer). Further, beamforming and/or beam steering can be employed to facilitate receiving and transmitting across multiple frequency ranges or channels (e.g., multiple-in-multiple-out (MIMO), massive MIMO).

The high frequency 5G antenna elements can have a variety of configurations. For example, the 5G antenna elements can be or include co-planar waveguide elements, patch arrays (e.g., mesh-grid patch arrays), other suitable 5G antenna configurations. The antenna elements can be configured to provide MIMO, massive MIMO functionality, beam steering, and the like. As used herein "massive" MIMO functionality generally refers to providing a large number transmission and receiving channels with an antenna array, for example 8 transmission (Tx) and 8 receive (Rx) channels (abbreviated as 8×8). Massive MIMO functionality may be provided with 8×8, 12×12, 16×16, 32×32, 64×64, or greater.

The antenna elements can have a variety of configurations and arrangements and can be fabricated using a variety of manufacturing techniques. As one example, the antenna elements and/or associated elements (e.g., ground elements, feed lines, etc.) can employ fine pitch technology. Fine pitch technology generally refers to small or fine spacing between their components or leads. For example, feature dimensions and/or spacing between antenna elements (or between an antenna element and a ground plane) can be about 1,500 micrometers or less, in some embodiments 1,250 micrometers or less, in some embodiments 750 micrometers or less (e.g., center-to-center spacing of 1.5 mm or less), 650 micrometers or less, in some embodiments 550 micrometers or less, in some embodiments 450 micrometers or less, in some embodiments 350 micrometers or less, in some embodiments 250 micrometers or less, in some embodiments 150 micrometers or less, in some embodiments 100 micrometers or less, and in some embodiments 50 micrometers or less. However, it should be understood that feature sizes and/or spacings that are smaller and/or larger may be employed within the scope of this disclosure.

As a result of such small feature dimensions, antenna systems can be achieved with a large number of antenna elements in a small footprint. For example, an antenna array can have an average antenna element concentration of greater than 1,000 antenna elements per square centimeter, in some embodiments greater than 2,000 antenna elements per square centimeter, in some embodiments greater than 3,000 antenna elements per square centimeter, in some embodiments greater than 4,000 antenna elements per square centimeter, in some embodiments greater than 6,000 antenna elements per square centimeter, and in some embodiments greater than about 8,000 antenna elements per square centimeter. Such compact arrangement of antenna elements can provide a greater number of channels for MIMO functionality per unit area of the antenna area. For example, the number of channels can correspond with (e.g., be equal to or proportional with) the number of antenna elements.

Figure 8:
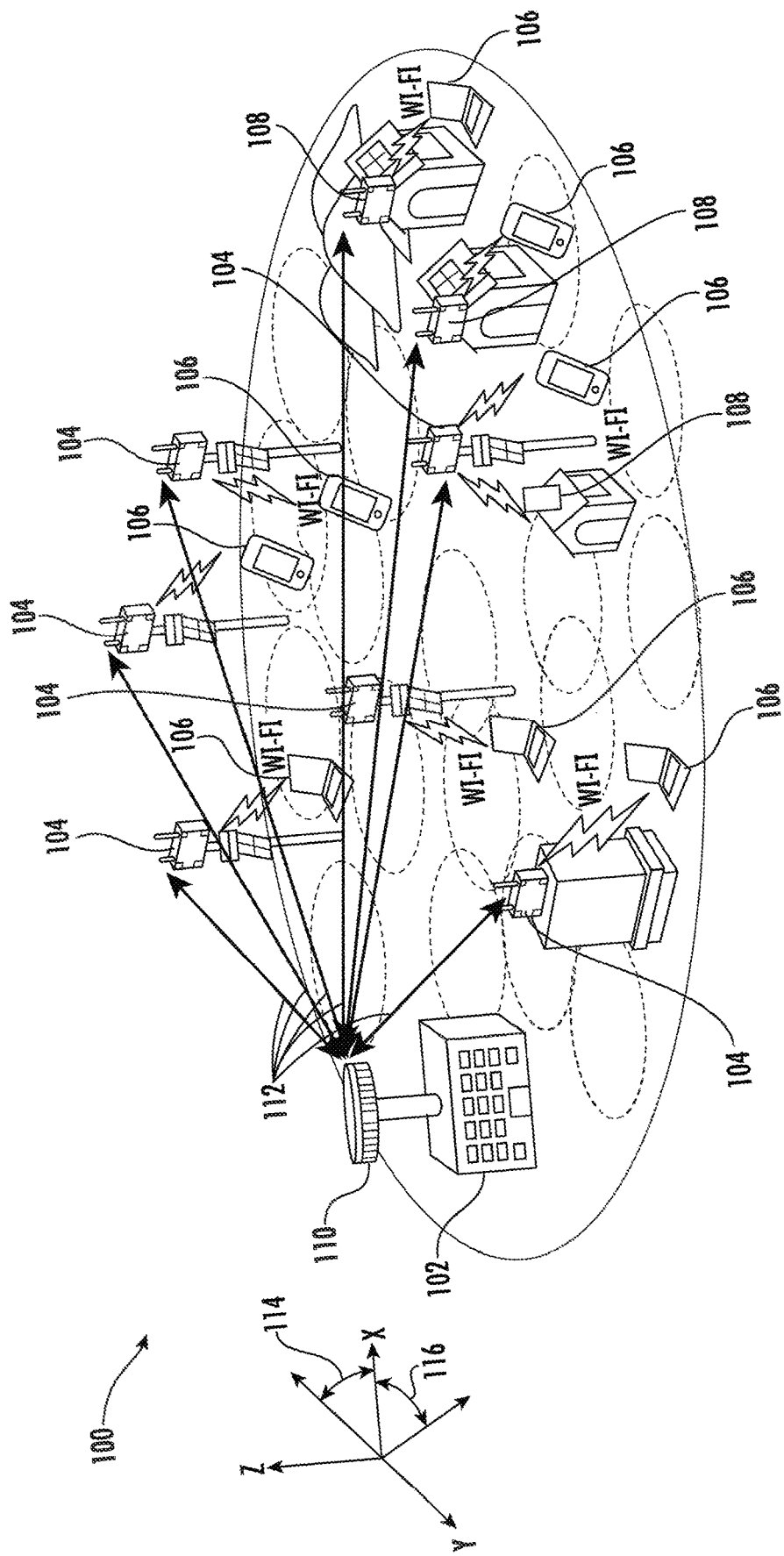
FIG. 8 depicts a 5G antenna system including a base station, one or more relay stations, one or more user computing devices, one or more or more Wi-Fi repeaters according to aspects of the present disclosure.

Referring to FIG. 8, one embodiment of a 5G antenna system 100 is shown that also includes a base station 102, one or more relay stations 104, one or more user computing devices 106, one or more Wi-Fi repeaters 108 (e.g., "femtocells"), and/or other suitable antenna components for the 5G antenna system 100. The relay stations 104 can be configured to facilitate communication with the base station 102 by the user computing devices 106 and/or other relay stations 104 by relaying or "repeating" signals between the base station 102 and the user computing devices 106 and/or relay stations 104. The base station 102 can include a MIMO antenna array 110 configured to receive and/or transmit radio frequency signals 112 with the relay station(s) 104, Wi-Fi repeaters 108, and/or directly with the user computing device(s) 106. The user computing device 306 is not necessarily limited by the present invention and include devices such as 5G smartphones.

The MIMO antenna array 110 can employ beam steering to focus or direct radio frequency signals 112 with respect to the relay stations 104. For example, the MIMO antenna array 110 can be configured to adjust an elevation angle 114 with respect to an X-Y plane and/or a heading angle 116 defined in the Z-Y plane and with respect to the Z direction. Similarly, one or more of the relay stations 104, user computing devices 106, Wi-Fi repeaters 108 can employ beam steering to improve reception and/or transmission ability with respect to MIMO antenna array 110 by directionally tuning sensitivity and/or power transmission of the device 104, 106, 108 with respect to the MIMO antenna array 110 of the base station 102 (e.g., by adjusting one or both of a relative elevation angle and/or relative azimuth angle of the respective devices).

Figure 9A:
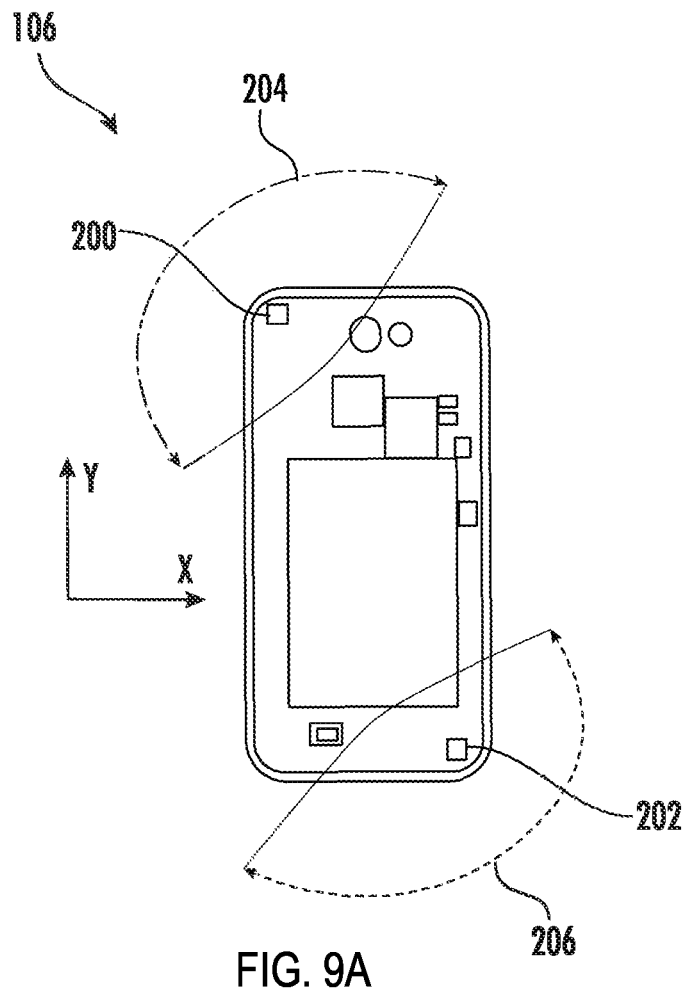
FIG. 9A illustrates a top-down view of an example user computing device including 5G antennas according to aspects of the present disclosure.
Figure 9B:
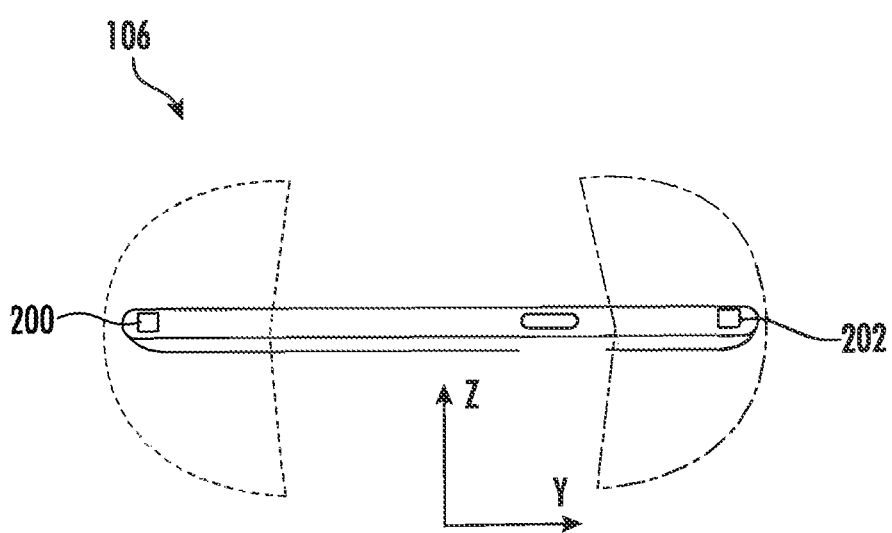
FIG. 9B illustrates a side elevation view of the example user computing device of FIG. 9A including 5G antennas according to aspects of the present disclosure.

FIGS. 9A and 9B illustrate a top-down and side elevation view, respectively, of an example user computing device 106. The user computing device 106 may include one or more antenna elements 200, 202 (e.g., arranged as respective antenna arrays). Referring to FIG. 9A, the antenna elements 200, 202 can be configured to perform beam steering in the X-Y plane (as illustrated by arrows 204, 206 and corresponding with a relative azimuth angle). Referring to FIG. 9B, the antenna elements 200, 202 can be configured to perform beam steering in the Z-Y plane (as illustrated by arrows 204, 206).

Figure 10:
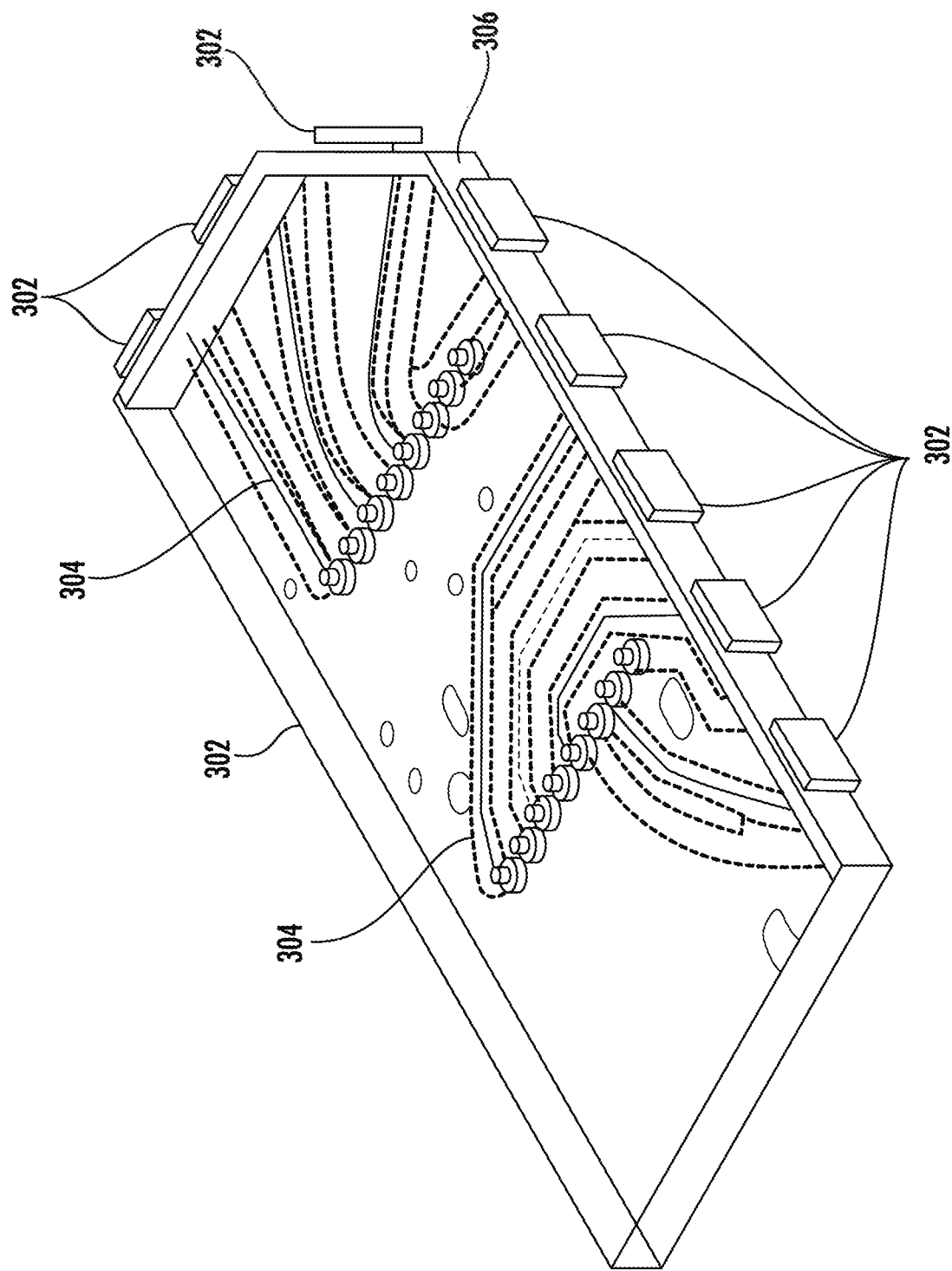
FIG. 10 illustrates an enlarged view of a portion of the user computing device of FIG. 9A.

FIG. 10 depicts a simplified schematic view of a plurality of antenna arrays 302 connected using respective feed lines 304 (e.g., with a front end module). The antenna arrays 302 can be mounted to a side surface 306 of a substrate 308, which may be formed from the polymer composition of the present invention. The antenna arrays 302 can include a plurality of vertically connected elements (e.g., as a mesh-grid array). Thus, the antenna array 302 can generally extend parallel with the side surface 306 of the substrate 308. Shielding can optionally be provided on the side surface 306 of the substrate 308 such that the antenna arrays 302 are located outside of the shielding with respect to the substrate 308. The vertical spacing distance between the vertically connected elements of the antenna array 302 can correspond with the "feature sizes" of the antenna arrays 320. As such, in some embodiments, these spacing distances may be relatively small (e.g., less than about 750 micrometers) such that the antenna array 302 is a "fine pitch" antenna array 302.

Figure 11:
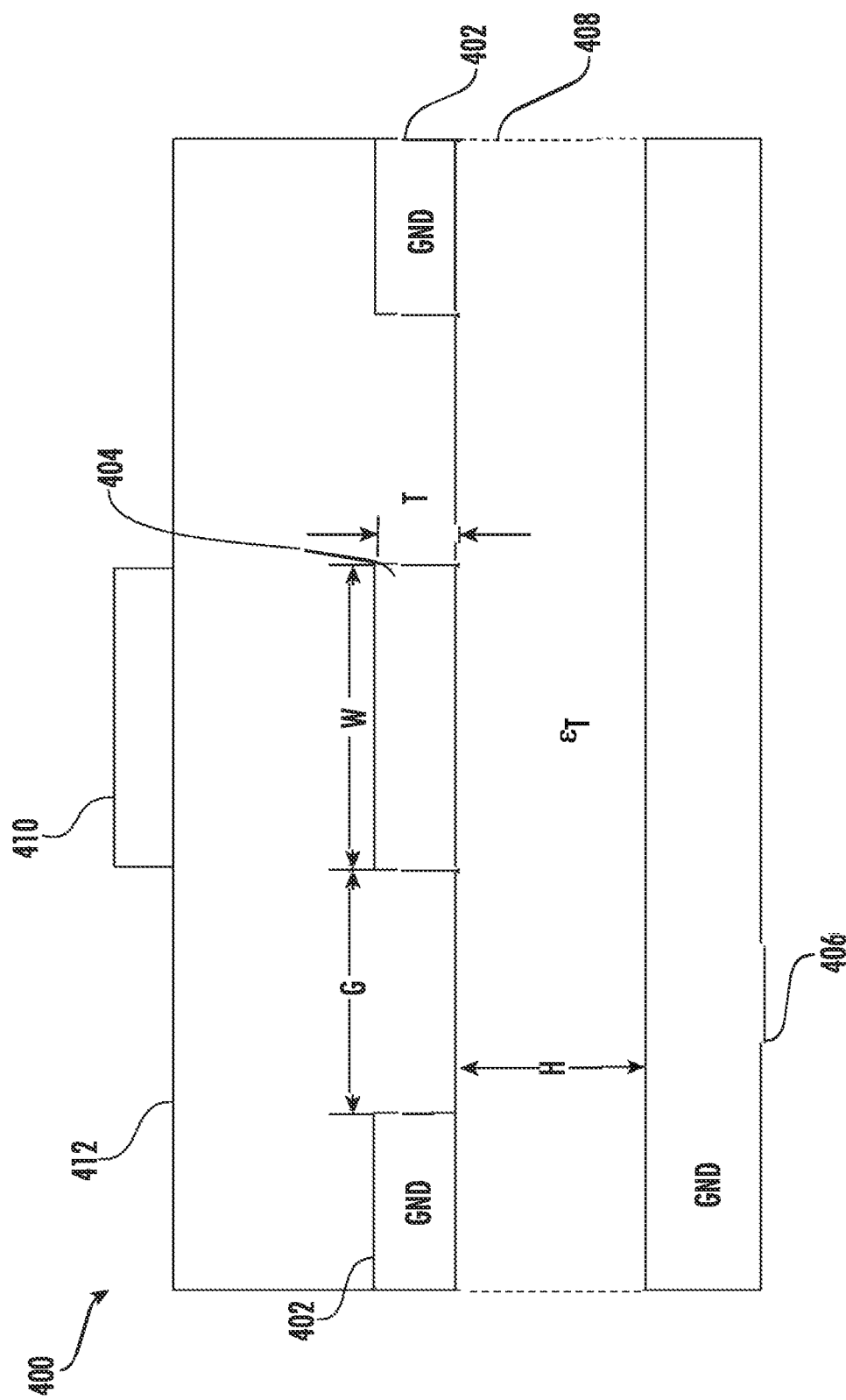
FIG. 11 illustrates a side elevation view of co-planar waveguide antenna array configuration according to aspects of the present disclosure.

FIG. 11 illustrates a side elevation view of a co-planar waveguide antenna 400 configuration. One or more co-planar ground layers 402 can be arranged parallel with an antenna element 404 (e.g., a patch antenna element). Another ground layer 406 may be spaced apart from the antenna element by a substrate 408, which may be formed from the polymer composition of the present invention. One or more additional antenna elements 410 can be spaced apart from the antenna element 404 by a second layer or substrate 412, which may also be formed from the polymer composition of the present invention. The dimensions "G" and "W" may correspond with "feature sizes" of the antenna 400. The "G" dimension may correspond with a distance between the antenna element 404 and the co-planar ground layer(s) 406. The "W" dimension can correspond with a width (e.g., linewidth) of the antenna element 404. As such, in some embodiments, dimensions "G" and "W" may be relatively small (e.g., less than about 750 micrometers) such that the antenna 400 is a "fine pitch" antenna 400.

Figure 12A:
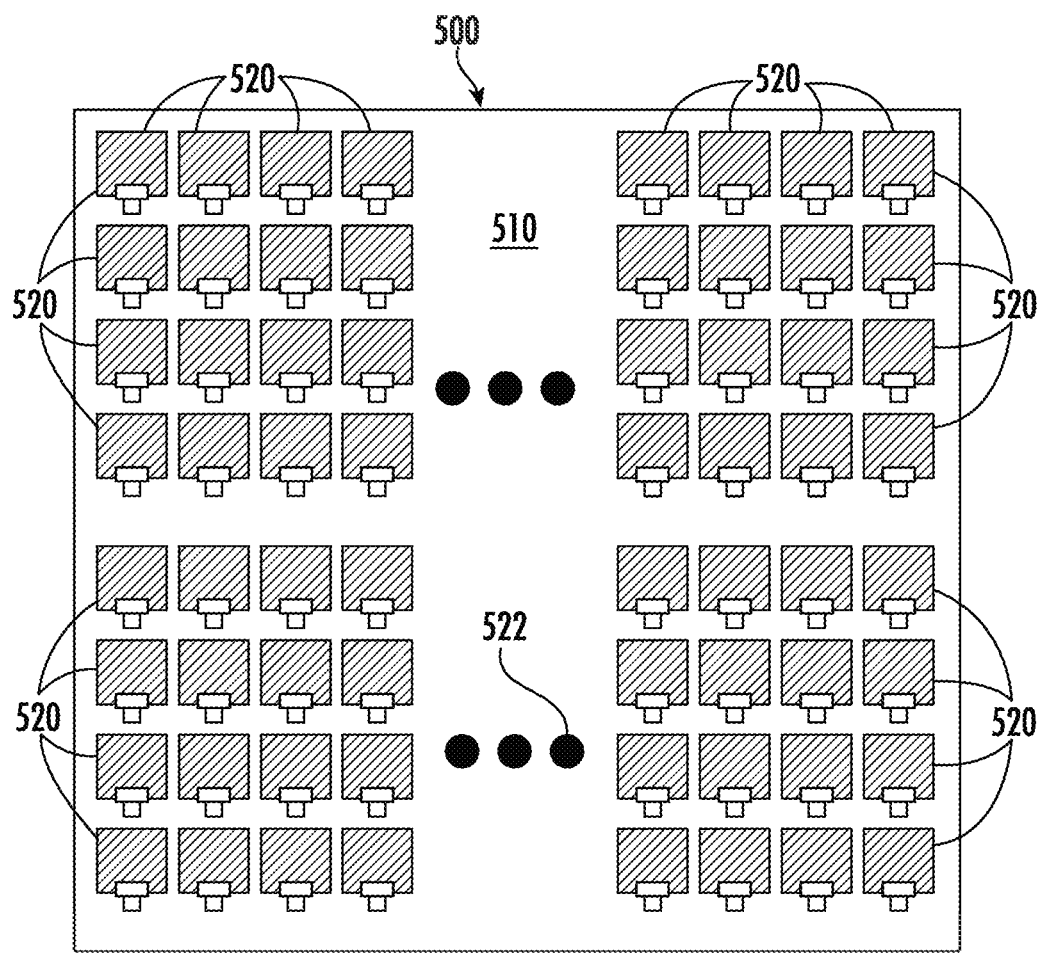
FIG. 12A illustrates an antenna array for massive multiple-in-multiple-out configurations according to aspects of the present disclosure.

FIG. 12A illustrates an antenna array 500 according to another aspect of the present disclosure. The antenna array 500 can include a substrate 510, which may be formed from the polymer composition of the present invention, and a plurality of antenna elements 520 formed thereon. The plurality of antenna elements 520 can be approximately equally sized in the X- and/or Y-directions (e.g., square or rectangular). The plurality of antenna elements 520 can be spaced apart approximately equally in the X- and/or Y-directions. The dimensions of the antenna elements 520 and/or spacing therebetween can correspond with "feature sizes" of the antenna array 500. As such, in some embodiments, the dimensions and/or spacing may be relatively small (e.g., less than about 750 micrometers) such that the antenna array 500 is a "fine pitch" antenna array 500. As illustrated by the ellipses 522, the number of columns of antenna elements 520 illustrated in FIG. 12 is provided as an example only. Similarly, the number of rows of antenna element 520 is provided as an example only.

The tuned antenna array 500 can be used to provide massive MIMO functionality, for example in a base station (e.g., as described above with respect to FIG. 8). More specifically, radio frequency interactions between the various elements can be controlled or tuned to provide multiple transmitting and/or receiving channels. Transmitting power and/or receiving sensitivity can be directionally controlled to focus or direct radio frequency signals, for example as described with respect to the radio frequency signals 112 of FIG. 8. The tuned antenna array 500 can provide a large number of antenna elements 522 in a small footprint. For example, the tuned antenna 500 can have an average antenna element concentration of 1,000 antenna elements per square cm or greater. Such compact arrangement of antenna elements can provide a greater number of channels for MIMO functionality per unit area. For example, the number of channels can correspond with (e.g., be equal to or proportional with) the number of antenna elements.

Figure 12C:
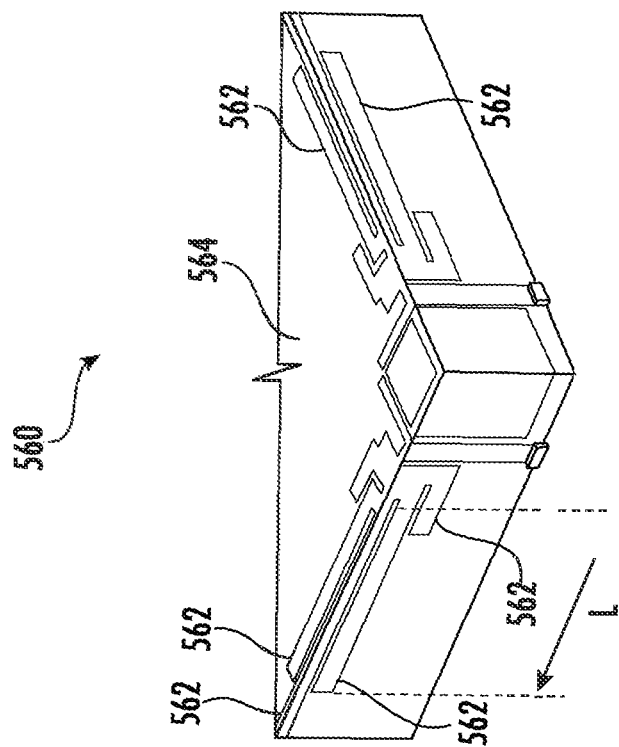
FIG. 12C illustrates an example antenna configuration according to aspects of the present disclosure.
Figure 12B:
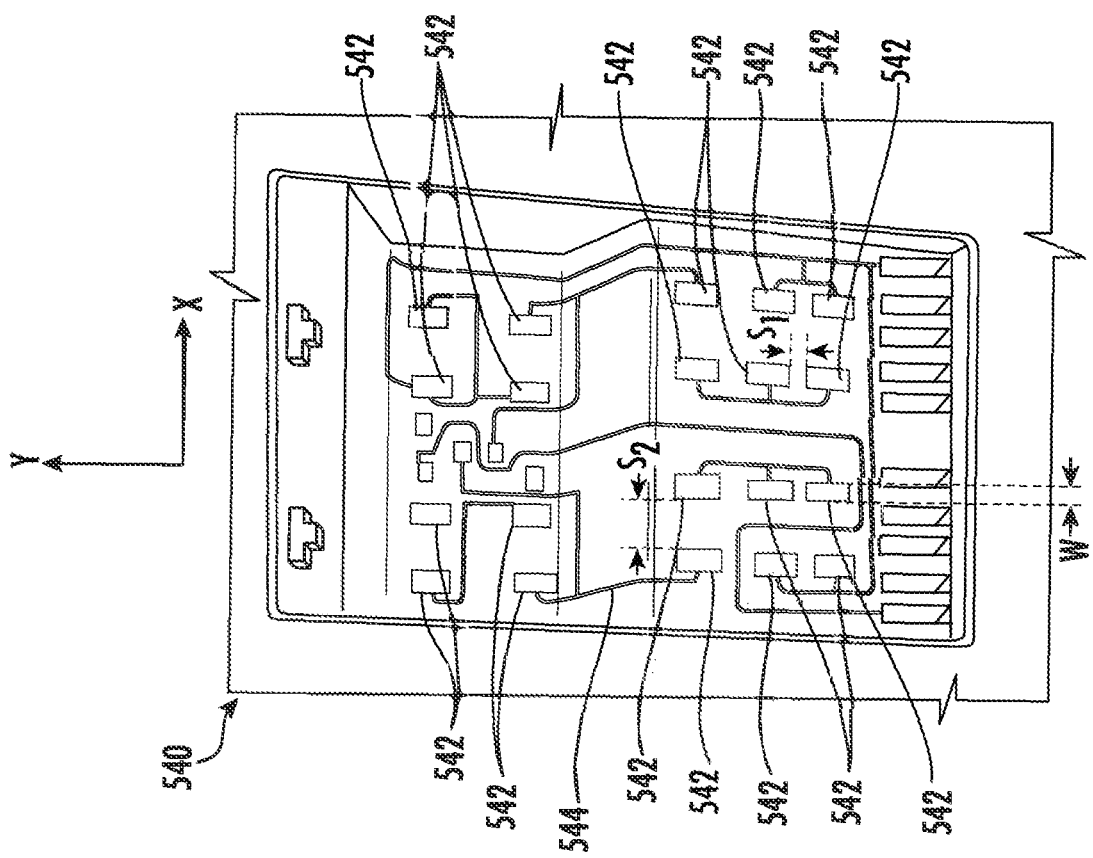
FIG. 12B illustrates an antenna array formed with laser direct structuring according to aspects of the present disclosure.

FIG. 12B illustrates an antenna array 540 formed with laser direct structuring, which may optionally be employed to form the antenna elements. The antenna array 540 can include a plurality of antenna elements 542 and plurality of feed lines 544 connecting the antenna elements 542 (e.g., with other antenna elements 542, a front end module, or other suitable component). The antenna elements 542 can have respective widths "w" and spacing distances "$S_1$" and "$S_2$" therebetween (e.g., in the X-direction and Y-direction, respectively). These dimensions can be selected to achieve 5G radio frequency communication at a desired 5G frequency. More specifically, the dimensions can be selected to tune the antenna array 540 for transmission and/or reception of data using radio frequency signals that are within the 5G frequency spectrum. The dimensions can be selected based on the material properties of the substrate. For example, one or more of "w", "$S_1$" or "$S_2$" can correspond with a multiple of a propagation wavelength ("λ") of the desired frequency through the substrate material (e.g., nλ/4 where n is an integer).

As one example, λ can be calculated as follows:

$$\lambda = \frac{c}{f\sqrt{\epsilon_R}}$$

where c is the speed of light in a vacuum, $\epsilon_R$ is the dielectric constant of the substrate (or surrounding material), f is the desired frequency.

FIG. 12C illustrates an example antenna configuration 560 according to aspects of the present disclosure. The antenna configuration 560 can include multiple antenna elements 562 arranged in parallel long edges of a substrate 564, which may be formed from the polymer composition of the present invention. The various antenna elements 562 can have respective lengths, "L" (and spacing distances therebetween) that tune the antenna configuration 560 for reception and/or transmission at a desired frequency and/or frequency range. More specifically, such dimensions can be selected based on a propagation wavelength, λ, at the desired frequency for the substrate material, for example as described above with reference to FIG. 12B.

Figure 13C:
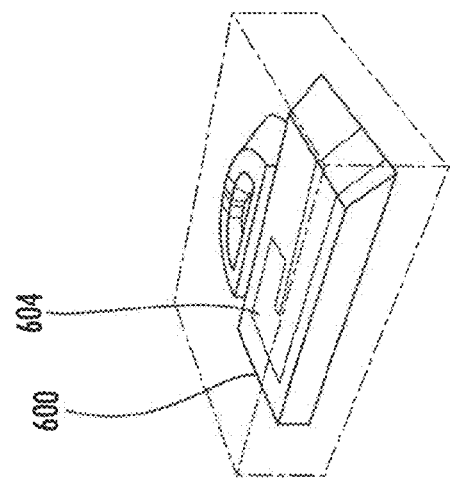
FIGS. 13A through 13C depict simplified sequential diagrams of a laser direct structuring manufacturing process that can be used to form an antenna system.
Figure 13B:
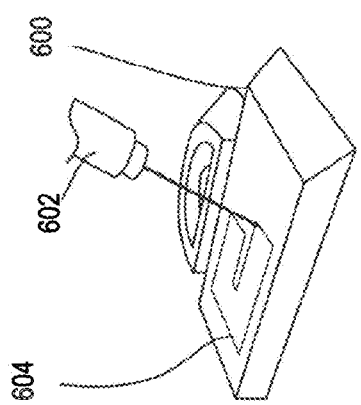
Figure 13A:
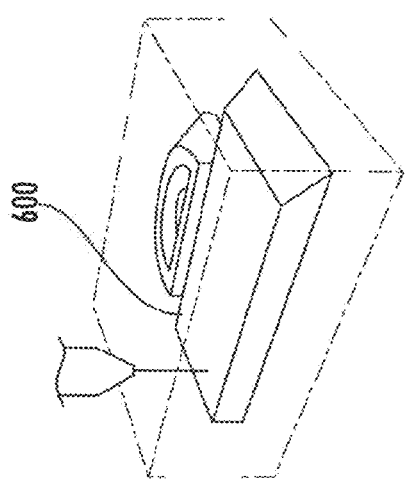

FIGS. 13A through 13C depict simplified sequential diagrams of a laser direct structuring manufacturing process that can be used to form antenna elements and/or arrays according to aspects of the present disclosure. Referring to FIG. 13A, a substrate 600 can be formed from the polymer composition of the present invention using any desired technique (e.g., injection molding). In certain embodiments, as shown in FIG. 13B, a laser 602 can be used to activate the laser activatable additive to form a circuit pattern 604 that can include one or more of the antenna elements and/or arrays. For example, the laser can melt conductive particles in the polymer composition to form the circuit pattern 604. Referring to FIG. 13C, the substrate 600 can be submerged in an electroless copper bath to plate the circuit pattern 604 and form the antenna elements, elements arrays, other components, and/or conductive lines therebetween.

The present invention may be better understood with reference to the following examples.

Test Methods

Melt Viscosity. The melt viscosity (Pa-s) may be determined in accordance with ISO Test No. 11443:2005 at a shear rate of 400 s$^{-1}$ and temperature 15° C. above the melting temperature (e.g., about 350° C.) using a Dynisco LCR7001 capillary rheometer. The rheometer orifice (die) had a diameter of 1 mm, length of 20 mm, L/D ratio of 20.1, and an entrance angle of 180°. The diameter of the barrel was 9.55 mm+0.005 mm and the length of the rod was 233.4 mm.

Melting Temperature: The melting temperature ("Tm") may be determined by differential scanning calorimetry ("DSC") as is known in the art. The melting temperature is the differential scanning calorimetry (DSC) peak melt temperature as determined by ISO Test No. 11357-2:2013. Under the DSC procedure, samples were heated and cooled at 20° C. per minute as stated in ISO Standard 10350 using DSC measurements conducted on a TA Q2000 Instrument.

Deflection Temperature Under Load ("DTUL"): The deflection under load temperature may be determined in accordance with ISO Test No. 75-2:2013 (technically equivalent to ASTM D648-07). More particularly, a test strip sample having a length of 80 mm, thickness of 10 mm, and width of 4 mm may be subjected to an edgewise three-point bending test in which the specified load (maximum outer fibers stress) was 1.8 Megapascals. The specimen may be lowered into a silicone oil bath where the temperature is raised at 2° C. per minute until it deflects 0.25 mm (0.32 mm for ISO Test No. 75-2:2013).

Tensile Modulus, Tensile Stress, and Tensile Elongation: Tensile properties may be tested according to ISO Test No. 527:2012 (technically equivalent to ASTM D638-14). Modulus and strength measurements may be made on the same test strip sample having a length of 80 mm, thickness of 10 mm, and width of 4 mm. The testing temperature may be about 23° C., and the testing speeds may be 1 or 5 mm/min.

Flexural Modulus, Flexural Stress, and Flexural Elongation: Flexural properties may be tested according to ISO Test No. 178:2010 (technically equivalent to ASTM D790-10). This test may be performed on a 64 mm support span. Tests may be run on the center portions of uncut ISO 3167 multi-purpose bars. The testing temperature may be about 23° C. and the testing speed may be 2 mm/min.

Unnotched and Notched Charpy Impact Strength: Charpy properties may be tested according to ISO Test No. ISO 179-1:2010) (technically equivalent to ASTM D256-10, Method B). This test may be run using a Type 1 specimen size (length of 80 mm, width of 10 mm, and thickness of 4 mm). When testing the notched impact strength, the notch may be a Type A notch (0.25 mm base radius). Specimens may be cut from the center of a multi-purpose bar using a single tooth milling machine. The testing temperature may be about 23° C.

Dielectric Constant ("Dk") and Dissipation Factor ("Df"): The dielectric constant (or relative static permittivity) and dissipation factor are determined using a known split-post dielectric resonator technique, such as described in Baker-Jarvis, et al., *IEEE Trans. on Dielectric and Electrical Insulation*, 5(4), p. 571 (1998) and Krupka, et al., *Proc. 7$^{th}$ International Conference on Dielectric Materials: Measurements and Applications, IEEE Conference Publication No. 430* (September 1996). More particularly, a plaque sample having a size of 80 mm×80 mm×1 mm was inserted between two fixed dielectric resonators. The resonator measured the permittivity component in the plane of the specimen. Five (5) samples are tested and the average value is recorded. The split-post resonator can be used to make dielectric measurements in the low gigahertz region, such as 1 GHz from 2 GHz.

Heat Cycle Test: Specimens are placed in a temperature control chamber and heated/cooled within a temperature range of from −30° C. and 100° C. Initially, the samples are heated until reaching a temperature of 100° C., when they were immediately cooled. When the temperature reaches −30° C., the specimens are immediately heated again until reaching 100° C. Twenty three (23) heating/cooling cycles may be performed over a 3-hour time period.

Example 1

Samples 1-7 are formed from various combinations of liquid crystalline polymers (LCP 1 and LCP 2), copper chromite filler (CuCr$_2$O$_4$), glass fibers, alumina trihydrate ("ATH"), lubricant (polyethylene wax), and polytetrafluoroethylenes (PTFE 1 and PTFE 2). LCP 1 is formed from 43% HBA, 20% NDA, 9% TA, and 28% HQ. LCP 2 is formed from 60% HBA, 4% HNA, 18% TA, and 18% BP. PTFE 1 is a powder of polytetrafluoroethylene particles having a D50 particle size of 4 μm, and PTFE 2 is a powder of polytetrafluoroethylene particles having a D50 particle size of 40 μm. Compounding was performed using an 18-mm single screw extruder. Parts are injection molded the samples into plaques (60 mm×60 mm).

TABLE 1

|  | 1 | 2 | 3 | 4 | 5 | 6 | 7 |
|---|---|---|---|---|---|---|---|
| LCP 1 | 77.6 | 78 | 80 | 73 | 68 | 73 | 68 |
| LCP 2 | 17.6 | — | — | — | — | — | — |
| Glass Fibers | 15 | 15 | 13 | 15 | 15 | 15 | 15 |
| Alumina Trihydrate | 0.2 | 0.2 | 0.2 | 0.2 | 0.2 | 0.2 | 0.2 |
| Lubricant | 0.2 | 0.2 | 0.2 | 0.2 | 0.2 | 0.2 | 0.2 |
| Copper Chromite | 4.4 | 6.6 | 6.6 | 6.6 | 6.6 | 6.6 | 6.6 |
| PTFE 1 | — | — | — | 5 | 10 | — | — |
| PTFE 2 | — | — | — | — | — | 5 | 10 |

Samples 1-7 were tested for thermal and mechanical properties. The results are set forth below in Table 2.

TABLE 2

| Sample | 1 | 2 | 3 | 4 | 5 | 6 | 7 |
|---|---|---|---|---|---|---|---|
| Dielectric Constant (2 GHz) | 3.73 | 3.69 | 3.64 | 3.66 | 3.6 | 3.7 | 3.6 |
| Dissipation Factor (2 GHz) | 0.0056 | 0.0036 | 0.0035 | 0.0042 | 0.0038 | 0.0036 | 0.004 |
| Dielectric Constant (10 GHz) | — | — | — | 3.74 | — | — | — |
| Dissipation Factor (10 GHz) | — | — | — | 0.0037 | — | — | — |
| DTUL at 1.8 MPa (° C.) | 239 | 282 | 278 | 258 | 277 | 277 | 270 |
| Charpy Notched (kJ/m$^2$) | 51 | 45 | 52 | 68 | 53 | 44 | 19 |
| Charpy Unnotched (kJ/m$^2$) | 58 | 57 | 60 | 80 | 77 | 55 | 36 |
| Tensile Strength (MPa) | 134 | 142 | 140 | 129 | 113 | 164 | 126 |
| Tensile Modulus (MPa) | 10,547 | 12,090 | 11,880 | 8,971 | 10,026 | 12,666 | 12,359 |
| Tensile Elongation (%) | 3.08 | 2.56 | 2.58 | 3.74 | 2.98 | 2.82 | 1.7 |
| Flexural Strength (MPa) | 158 | 189 | 189 | 140 | 143 | 191 | 174 |
| Flexural Modulus (MPa) | 9,834 | 10,601 | 10,510 | 8,725 | 9,921 | 11,314 | 11,061 |
| Flexural Elongation (%) | >3.5 | >3.5 | >3.5 | >3.5 | >3.5 | 3.24 | 3.33 |
| Melt Viscosity (Pa · s) at 1,000 s$^{-1}$ | 24 | 36 | 37 | 30 | 44 | 44 | 62 |
| Melting Temperature (° C., 1$^{st}$ heat of DSC) | 309.98 | 320.26 | 320.58 | 324.25 | 324.65 | 320.76 | 322.95 |

Example 2

Sample 8 is formed from liquid crystalline polymers (LCP 2 and LCP 3, hollow glass spheres, glass powder, glass fibers, and alumina trihydrate. LCP 3 is formed from 48% HNA, 2% HBA, 25% BP, and 25% TA. The glass powder had a dielectric constant of 4.8 as determined at a frequency of 1 GHz. Compounding was performed using a 25-mm single screw extruder.

TABLE 3

| Sample | 8 |
|---|---|
| LCP 3 | 49.8 |
| LCP 2 | 15.4 |
| Hollow Glass Spheres | 17.0 |
| Glass Powder | 1.0 |
| Glass Fibers (4 mm length) | 10.0 |
| Alumina Trihydrate | 0.2 |
| Copper Chromite | 6.6 |

The samples were then tested for thermal and mechanical properties. The results are set forth below in Table 4.

TABLE 4

| Sample | 8 |
|---|---|
| Dielectric Constant (2 GHz) | 3.07 |
| Dissipation Factor (2 GHz) | 0.0043 |
| Dielectric Constant (10 GHz) | 3.14 |
| Dissipation Factor (10 GHz) | 0.0035 |
| Melt Viscosity at 1,000 s$^{-1}$ (Pa-s) | 55.5 |
| Melt Viscosity at 400 s$^{-1}$ (Pa-s) | 88.9 |
| Melting Temperature (° C.) | 338.6 |
| DTUL at 1.8 MPa (° C.) | 217 |
| Tensile Strength (MPa) | 81 |
| Tensile Modulus (MPa) | 7,658 |
| Tensile Elongation (%) | 1.41 |
| Flexural Strength (MPa) | 116 |
| Flexural Modulus (MPa) | 7,241 |
| Flexural Elongation (%) | 1.91 |
| Charpy Notched Impact Strength (kJ/m$^2$) | 3.1 |
| Charpy Unnotched Impact Strength (kJ/m$^2$) | 7.3 |

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A laser activatable polymer composition comprising at least one laser activatable additive and at least one high naphthenic thermotropic liquid crystalline polymer that contains repeating units derived from naphthenic hydroxycarboxylic and/or dicarboxylic acids in an amount of about 18 mol. % or more, wherein the polymer composition exhibits a dielectric constant of about 4 or less as determined at a frequency of 2 GHz.

2. The polymer composition of claim 1, wherein the high naphthenic thermotropic liquid crystalline polymer contains repeating units derived from one or more aromatic dicarboxylic acids, one or more aromatic hydroxycarboxylic acids, or a combination thereof.

3. The polymer composition of claim 2, wherein the high naphthenic thermotropic liquid crystalline polymer further contains repeating units derived from one or more aromatic diols.

4. The polymer composition of claim 1, wherein the high naphthenic thermotropic liquid crystalline polymer contains repeating units derived from 2,6-naphthalenedicarboxylic acid in an amount of about 10 mol. % or more.

5. The polymer composition of claim 1, wherein the liquid crystalline polymer contains repeating units derived from 6-hydroxy-2-naphthoic acid in an amount of about 30 mol. % or more.

6. The polymer composition of claim 4, wherein the liquid crystalline polymer contains repeating units derived from 6-hydroxy-2-naphthoic acid and 4-hydroxybenzoic acid in a molar ratio of from about 0.1 to about 40.

7. The polymer composition of claim 1, wherein the laser activatable additive contains spinel crystals having the following general formula:

wherein,
A is a metal cation having a valance of 2; and
B is a metal cation having a valance of 3.

8. The polymer composition of claim 7, wherein the spinel crystals include $MgAl_2O_4$, $ZnAl_2O_4$, $FeAl_2O_4$, $CuFe_2O_4$, $CuCr_2O_4$, $MnFe_2O_4$, $NiFe_2O_4$, $TiFe_2O_4$, $FeCr_2O_4$, $MgCr_2O_4$, or a combination thereof.

9. The polymer composition of claim 1, wherein the polymer composition is free of a dielectric material.

10. The polymer composition of claim 1, further comprising at least one fibrous filler.

11. The polymer composition of claim 10, wherein the weight ratio of the fibrous filler to the laser activatable additive is from about 1 to about 5.

12. The polymer composition of claim 1, wherein the polymer composition further comprises a particulate filler.

13. The polymer composition of claim 12, wherein the particulate filler includes mica.

14. The polymer composition of claim 1, wherein the polymer composition exhibits a dielectric constant of from about 1.5 to about 4 at a frequency of 2 GHz.

15. The polymer composition of claim 1, wherein the polymer composition exhibits a dissipation factor of about 0.0009 or less at a frequency of 2 GHz.

16. The polymer composition of claim 1, further comprising at least one low naphthenic thermotropic liquid crystalline polymer that contains repeating units derived from naphthenic hydroxycarboxylic and/or dicarboxylic acids in an amount of less than 10 mol. %.

17. The polymer composition of claim 16, wherein the low naphthenic thermotropic liquid crystalline polymer constitutes from about 0.5 wt. % to about 45 wt. % of the polymer composition and the high naphthenic thermotropic liquid crystalline polymer constitutes from about 55 wt. % to about 99.5 wt. % of the polymer composition.

18. The polymer composition of claim 1, wherein the composition comprises a hydrophobic material.

19. The polymer composition of claim 18, wherein the hydrophobic material comprises polytetrafluoroethylene.

20. The polymer composition of claim 1, wherein the composition comprises a hollow filler.

* * * * *